United States Patent
Ide et al.

(10) Patent No.: US 6,323,484 B1
(45) Date of Patent: Nov. 27, 2001

(54) METHOD AND APPARATUS FOR SAMPLE CURRENT SPECTROSCOPY SURFACE MEASUREMENT

(75) Inventors: Takashi Ide; Hiroshi Itoh, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/416,780

(22) Filed: Oct. 13, 1999

(30) Foreign Application Priority Data

Oct. 14, 1998 (JP) ................................................. 10-292102

(51) Int. Cl.[7] ........................... H05H 3/02; G01N 23/00; G21K 7/00
(52) U.S. Cl. ........................... 250/306; 250/251; 250/307; 250/309
(58) Field of Search ..................................... 250/306, 307, 250/309, 251

(56) References Cited

U.S. PATENT DOCUMENTS

| | | | |
|---|---|---|---|
| 4,633,084 | * 12/1986 | Gruen et al. | 250/306 |
| 5,034,605 | * 7/1991 | Bayly | 250/309 |
| 5,089,699 | * 2/1992 | Ose et al. | 250/306 |

FOREIGN PATENT DOCUMENTS

| | | |
|---|---|---|
| 61-13638 | 1/1986 | (JP) . |
| 61-171046 | 8/1986 | (JP) . |
| 63-77130 | 4/1988 | (JP) . |
| 9-245713 | 9/1997 | (JP) . |

* cited by examiner

*Primary Examiner*—Jack Berman
*Assistant Examiner*—Kalimah Fernandez
(74) *Attorney, Agent, or Firm*—Hutchins, Wheeler & Dittmar

(57) ABSTRACT

An apparatus and a method for sample current spectroscopy surface measurement to inspect crystailnity of a sample surface. An electron beam is irradiated onto a surface of a sample by an electron gun. A variable voltage source supplies an acceleration voltage which is variable to change an acceleration energy of the electron beam irradiated from the electron gun onto the sample surface. A sample current measurement means measures a sample current which flows into a sample when the electron beam is irradiated from the electron gun onto the sample surface. Variation of the sample current is detected by measuring the sample current by the sample current measurement means when the acceleration energy of the electron beam irradiated by the electron gun onto the sample surface is changed by the variable voltage source, thereby crystallinity of the sample surface is inspected.

13 Claims, 12 Drawing Sheets

METHOD AND APPARATUS FOR SAMPLE CURRENT SPECTROSCOPY SURFACE MEASUREMENT

FIELD OF THE INVENTION

The present invention relates generally to an analysis technology of a surface condition of a sample, such as a semiconductor substrate of an integrated circuit device and so on, and more particularly to a sample current spectroscopy surface measurement method and measurement device for inspecting crystallinity of a sample surface.

BACKGROUND OF THE INVENTION

As conventional methods of inspecting crystallinity of a surface of a sample, such as a semiconductor substrate of an integrated circuit device and so on, there are known a low energy electron diffraction (LEED) method and a reflection high energy electron diffraction (RHEED) method, both of which use electron ray or beam, and there is also known a small incident angle X-ray diffraction method which uses X-ray. In each of these methods, electron beam or X-ray is irradiated onto a sample, and a diffraction pattern of scattered electron beam or X-ray is detected to inspect crystallinity of a sample surface. Also, in order to estimate crystallinity of a local area of a sample, there are known a method of performing electron diffraction measurement by using converged electron beam, and a method by using a scanning tunneling microscope which uses a probe.

In a recent semiconductor device having a very high integration degree, it is often required to form a narrow and deep hole in a vertical direction on the surface of a semiconductor element, during a manufacturing process thereof. However, when an aspect ratio of such hole is very large, an analysis of the bottom area of such hole was impossible. This is because, in the conventional diffraction method using electron beam or X-ray, a direction of incidence of electron beam or X-ray onto the surface of a sample and a direction of emanation of detected electrons or X-ray are limited. Also, in the observation method by a scanning tunneling microscope which uses a probe, it was difficult to insert the probe into such hole, and, therefore, an analysis of the bottom area of such hole was difficult because of the structural limitation of the microscope.

SUMMARY OF THE INVENTION

Therefore, it is an object of the present invention to obviate the above-mentioned problems of the prior arts.

It is another object of the present invention to provide a surface measurement apparatus and method in which crystallinity of a surface of a sample can be inspected without detecting electrons or X-ray scattered from the surface of the sample.

It is still another object of the present invention to provide a surface measurement apparatus and method in which analysis of crystallinity of a bottom region of a hole having large aspect ratio and formed on the surface of a sample can be done without detecting electrons or X-ray scattered from the bottom region.

According to one aspect of the present invention, there is provided an apparatus for sample current spectroscopy surface measurement comprising: an electron gun for irradiating an electron beam onto a surface of a sample; a variable voltage source for supplying an acceleration voltage which is variable to change an acceleration energy of said electron beam irradiated from said electron gun onto said surface of said sample; and a sample current measurement means for measuring a sample current which flows into a sample when said electron beam is irradiated from said electron gun onto said surface of said sample; wherein variation of said sample current is detected by measuring said sample current by said sample current measurement means when said acceleration energy of said electron beam irradiated by said electron gun onto said surface of said sample is changed by said variable voltage source.

In the above-mentioned apparatus, it is possible to inspect crystallinity of the surface of the sample by detecting the variation of the sample current.

It is preferable that the above apparatus comprises an electron lens for focusing said electron beam emitted from said electron gun and said electron beam emitted from said electron gun is irradiated onto said surface of said sample after being focused by said electron lens.

It is also preferable that the above apparatus further comprises an electron deflection means for scanning said electron beam emitted from said electron gun, and that the electron beam is irradiated onto and scanned on said surface of said sample by said electron deflection means, and variation of said sample current is detected by using said sample current measurement means in each of measurement points within a scanning region on the surface of the sample while changing said acceleration energy of electrons irradiated onto said surface of said sample from said electron gun by said variable voltage source, thereby inspecting crystallinity of said surface of said sample.

It is also preferable that the above apparatus further comprises a Faraday cup onto which said electron beam from said electron gun is irradiated in place of said surface of said sample; and a Faraday cup current measuring means which measures a current flowing into said Faraday cup when said electron beam is irradiated onto said Faraday cup by said electron gun, and that variation of said current flowing into said Faraday cup is detected by measuring said current flowing into said Faraday cup by said Faraday cup current measuring means when said acceleration energy of said electron beam irradiated onto said Faraday cup by said electron gun is changed by said variable voltage source, and variation of said sample current is detected by measuring said sample current by said sample current measurement means when said acceleration energy of said electron beam irradiated onto said surface of said sample by said electron gun is changed by said variable voltage source, and each sample current value measured by said sample current measurement means is normalized or standardized by using a current value at a corresponding acceleration energy measured by said Faraday cup current measuring means.

It is preferable that the acceleration energy of said electron beam irradiated from said electron gun is changed in a range from 10 to 5000 electron volts by said variable voltage source.

It is possible to further provide a sinusoidal wave voltage generating means, and to superimpose a sinusoidal wave voltage generated by said sinusoidal wave voltage generating means on said acceleration voltage supplied by said variable voltage source, when variation of said sample current is detected by measuring said sample current by said sample current measurement means while changing said acceleration energy of said electron beam irradiated onto said surface of said sample by said electron gun by said variable voltage source.

According to another aspect of the present invention there is provided a method for sample current spectroscopy surface measurement comprising: irradiating an electron beam onto a surface of a sample; and inspecting crystallinity of said surface of said sample by measuring a variation of a sample current flowing into said sample when an acceleration energy of said electron beam irradiated onto said surface of said sample is changed.

It is preferable that the electron beam is focused by an electron lens and irradiated onto a local region on said surface of said sample, thereby crystallinity of said local region on said surface of said sample is inspected.

It is also preferable that the electron beam is focused by an electron lens and scanned on said surface of said sample, and that variation of said sample current is detected in each of measurement points within a scanning region on said surface of said sample while changing said acceleration energy of electrons irradiated onto said surface of said sample, thereby inspecting crystallinity of said surface of said sample.

It is also preferable that the above method further comprises irradiating said electron beam onto a Faraday cup; and variation of a current flowing into said Faraday cup is measured when an acceleration energy of said electron beam irradiated onto said Faraday cup is changed, and variation of said sample current is measured when said acceleration energy of said electron beam irradiated onto said surface of said sample is changed, and wherein each sample current value is normalized or standardized by using a current value of a current flowing into a Faraday cup at corresponding acceleration energy.

It is further preferable that measuring variation of a current flowing into said Faraday cup when an acceleration energy of said electron beam irradiated onto said Faraday cup is changed is performed prior to measuring variation of said sample current when said acceleration energy of said electron beam irradiated onto said surface of said sample is changed.

It is also preferable that the acceleration energy of said electron beam irradiated onto said surface of said sample is changed in a range from 10 to 5000 electron volts.

It is further preferable that a sinusoidal wave voltage is superimposed on said acceleration voltage, when variation of said sample current is detected by measuring said sample current while changing said acceleration energy of said electron beam irradiated onto said surface of said sample.

In the present invention, crystallinity of a sample surface is analyzed, by irradiating an electron beam onto the sample surface and by measuring a sample current flowing into or through a sample caused by the irradiated electron beam. Therefore, it is not necessary to detect electrons or X-ray scattered from the sample surface. As a result, according to the present invention, it is also possible to analyze crystallinity of an area at the bottom portion of a very deep and narrow hole, that is, a hole having a large aspect ratio, which is formed on the sample surface.

In the present invention, an electron beam accelerated by an acceleration energy which is preferably in a range from 10 to 5000 eV is irradiated onto the sample surface, and variation of sample current caused by a diffraction phenomenon occurring in a region near the sample surface is detected.

The above-mentioned variation of sample current caused by the diffraction phenomenon is considered to occur by the following process.

Most of the electrons irradiated onto the sample are elastic scattered within the sample and at a region near the sample surface. Here, energy of electrons is not lost by the elastic scattering. When the sample is a crystal, the elastic scattered electrons are diffracted, and a part of diffracted waves is emitted outside the sample. First order approximately, among whole diffracted waves, an intensity of diffracted waves which progresses toward inside of the sample and an intensity of diffracted waves which progresses toward outside of the sample are the same. Thus, it is supposed that approximately half of electrons which are elastic scattered are always emitted toward outside of the sample. However, in practice, since a potential felt by electrons inside the sample differs from that felt by electrons outside the sample, the diffracted waves progressing toward outside of the sample are refracted or reflected at the surface of the sample. Especially, among diffracted waves progressing toward outside of the sample, the diffracted waves progressing close to the sample surface, that is, the diffracted waves having a small incident angle toward the sample surface, is total reflected at the sample surface, and cannot go out of the sample. Therefore, due to the abovementioned refraction or reflection phenomenon, when the number of occurrence of the diffracted waves each having a small incident angle toward the sample surface becomes large, quantity of electrons emitted toward outside of the sample decreases. Number of occurrence of whole diffracted waves and number of occurrence of the diffracted waves each having a small incident angle toward the sample surface vary depending on an energy of an incident electron beam. As a result, when the energy of the incident electron beam is changed, if the number of occurrence of diffracted waves having small incident angles toward the sample surface varies, a quantity or proportion of electrons emitted toward outside of the sample among the electrons scattered in an area near the sample surface also varies.

As can be understood from the above, quantity or a proportion of electrons which are scattered and emitted toward outside of the sample when an electron beam is irradiated onto the sample varies depending on the variation of the number of occurrence of the diffracted waves having small incident angles toward the sample surface, that is, varies depending on the change of the energy of the incident electron beam. Sample current is obtained by subtracting quantity of electrons emitted from the sample from quantity of electrons incident onto the sample. Therefore, by inspecting a manner of variation of the sample current or a manner of variation of proportion of the sample current to the quantity of current of the incident electron beam when the acceleration energy of the incident electron beam is changed, it is possible to inspect variation of quantity or a proportion of electrons emitted from the sample, that is, variation of number of occurrence of diffracted waves having small incident angles toward the sample surface. In this way, since the sample current reflects the diffraction phenomenon of the scattered electrons and varies accordingly, the sample current reflects information on crystal in an area of a sample where an electron beam is irradiated. Therefore, by inspecting a manner of variation of a sample current when energy of an incident electron beam is changed, it is possible to inspect crystallinity of the area of the sample surface where the electron beam is irradiated.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the drawings, embodiments of the present invention will now be explained in detail.

Embodiment 1

Figure 1:
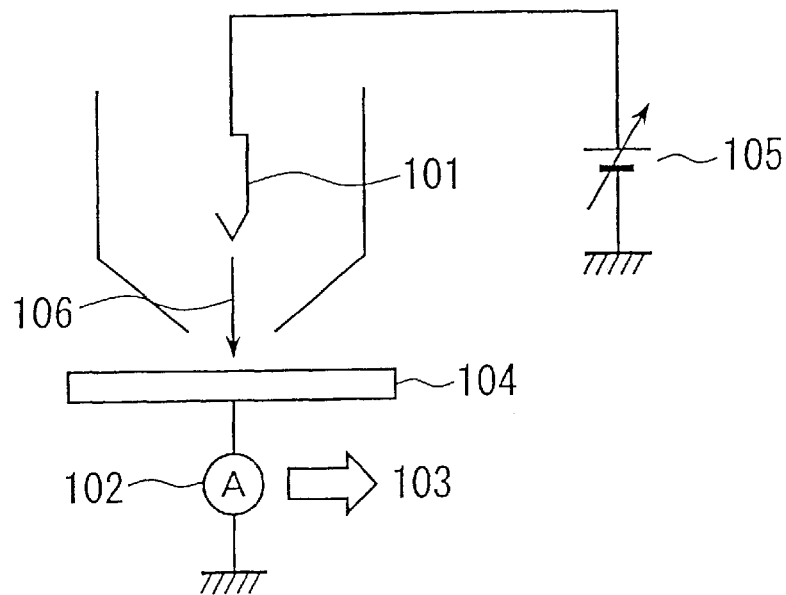
FIG. 1 is a conceptual view illustrating a sample current spectroscopy type surface measurement apparatus according to a first embodiment of the present invention.

FIG. 1 is a conceptual view illustrating a sample current spectroscopy type surface measurement apparatus according to a first embodiment of the present invention. This apparatus comprises an electron gun 101 which is disposed within an evacuated envelope and which can emit an electron beam onto a sample 104 also disposed within the envelope. This apparatus also comprises a variable voltage source 105 which is coupled, for example, between the electron gun 101 and the ground and which supplies an acceleration voltage to the electron gun 101, and a current detector 102 for detecting a sample current, for example, a current from the sample 104 to the ground.

In this apparatus, the electron beam 106 emitted from the electron gun 101 is irradiated onto the sample 104. In this embodiment, the electron gun 101 is constituted by an electron source of thermal filament type which uses $LaB_6$ as a material thereof. That is, the electron gun 101 is a thermoionic electron gun. Therefore, there is also provided a power source not shown in the drawing to supply a heating current to the electron gun 101. When an electron beam is irradiated onto the sample 104 from such electron gun 101, a current, i.e., a sample current, flows into the sample 104 to the ground. Quantity of such sample current is measured by the current detector 102 for detecting sample current.

In the first embodiment, acceleration energy of electrons irradiated from the electron gun 101 is changed by changing the acceleration voltage of electrons by using the variable voltage source 105. The acceleration energy of electrons is changed, for example, within a range from 10 through 5000 electron volts (eV). The acceleration voltage is thus changed and the sample current in each acceleration voltage is measured by the current detector 102. Thereby, variation of the sample current is measured with respect to the change of the acceleration voltage. Output data or signal 103 of the measured sample current is supplied to, for example, a computer and so on, and is processed in accordance with the necessity of display, analysis and so on.

Embodiment 2

Figure 2:
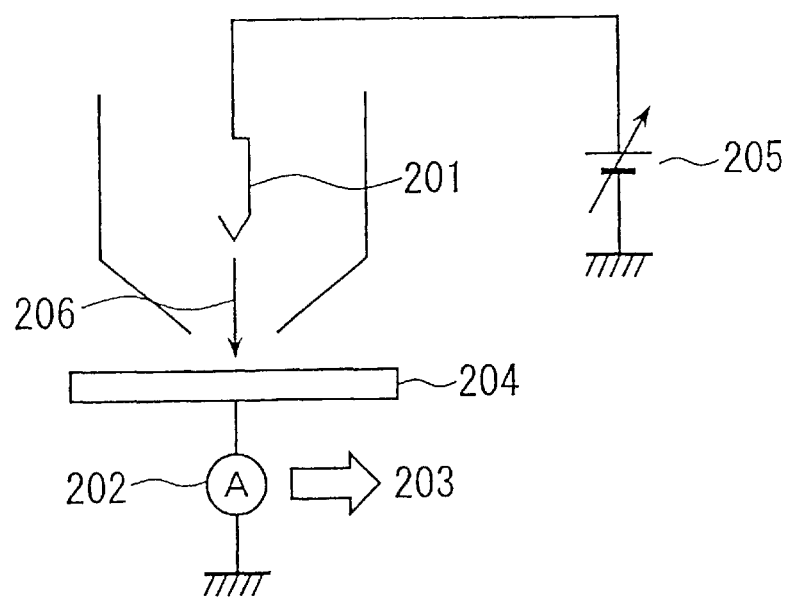
FIG. 2 is a conceptual view illustrating a sample current spectroscopy type surface measurement apparatus according to a second embodiment of the present invention.

FIG. 2 is a conceptual view illustrating a sample current spectroscopy type surface measurement apparatus according to a second embodiment of the present invention. Similarly to the first embodiment, this apparatus comprises an electron gun 201 which can emit an electron beam onto a sample 204. This apparatus also comprises a variable voltage source 205 which is coupled, for example, between the electron gun 201 and the ground, and a current detector 202 for detecting a sample current, for example, a current from the sample 204 to the ground.

In this apparatus, the electron beam 206 emitted from the electron gun 201 is irradiated onto the sample 204. In this embodiment, the electron gun 201 is constituted by an electron source of cold field emission type which uses tungsten as a material thereof. That is, the electron gun 201 is a field emission electron gun. By irradiating electron beam onto the sample 204 from such electron gun 201, a current flows inside the sample 204. Quantity of current of such sample current is measured by the current detector 202 for detecting sample current.

In the second embodiment, acceleration energy of electrons irradiated from the electron gun 201 is changed by changing the acceleration voltage of electrons by using the variable voltage source 205. The acceleration energy of electrons is changed, for example, within a range from 10 through 5000 electron volts (eV). While changing the acceleration voltage, the sample current is measured by the current detector 202. Thereby, variation of the sample current is measured with respect to the change of the acceleration voltage. Output data or signal 203 of the measured sample current is supplied to, for example, a computer and so on, and processed in accordance with the necessity of display, analysis and so on.

In the electron gun of the thermal filament type used in the first embodiment, that is, in the thermoionic electron gun, quantity of electrons emitted from the electron gun is large, but energy width of electrons emitted from the electron gun is broad, that is, energy distribution of electrons emitted from the electron gun is broad. Therefore, when the electron gun of the thermal filament type is used, energy resolution of analysis is not so high. On the other hand, in the electron gun of the cold field emission type used in the second embodiment, that is, in the field emission gun, energy width of electrons emitted from the electron gun is narrow, that is, the energy distribution of electrons emitted from the electron gun is sharp. Therefore, in the apparatus of the second embodiment, it is possible to perform analysis of high energy resolution.

Embodiment 3

Figure 3:
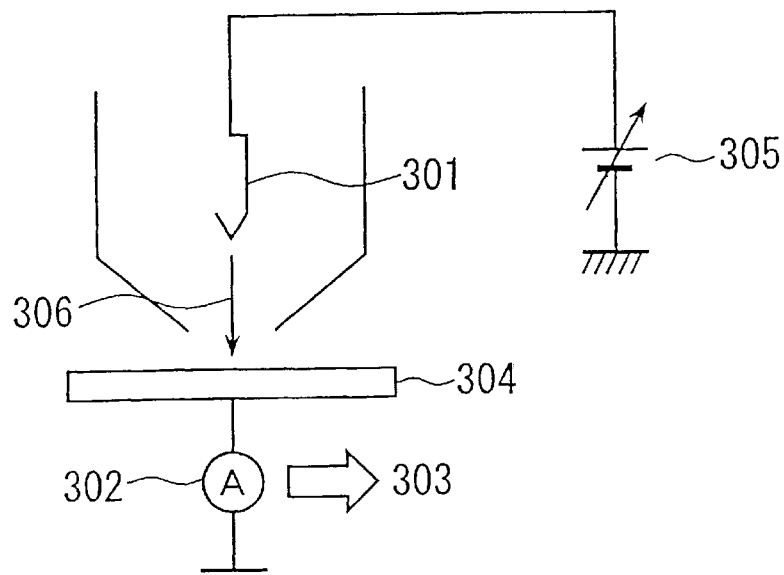
FIG. 3 is a conceptual view illustrating a sample current spectroscopy type surface measurement apparatus according to a third embodiment of the present invention.

FIG. 3 is a conceptual view illustrating a sample current spectroscopy type surface measurement apparatus according to a third embodiment of the present invention. This apparatus comprises an electron gun 301 which can emit an electron beam onto a sample 304. This apparatus also comprises a variable voltage source 305 which is coupled, for example, between the electron gun 301 and the ground and which supplies an acceleration voltage to the electron gun 301, and a current detector 302 for detecting a sample current, for example, a current from the sample 304 to the ground.

In this apparatus, the electron beam 306 emitted from the electron gun 301 is irradiated onto the sample 304. In this embodiment, the electron gun 301 is constituted by an electron source of thermal field emission type which uses tungsten as a material thereof. That is, the electron gun 301 is a Schottky emission electron gun. Therefore, there is also provided a power source not shown in the drawing to supply a heating current to the electron gun 301. By irradiating electron beam onto the sample 304 from such electron gun 301, a current flows inside the sample 304. Quantity of current of such sample current is measured by the current detector 302 for detecting sample current.

In the third embodiment, acceleration energy of electrons irradiated from the electron gun 301 is changed by changing the acceleration voltage of electrons by using the variable voltage source 305. The acceleration energy of electrons is changed, for example, within a range from 10 through 5000 electron volts (eV). While changing the acceleration voltage, the sample current is measured by the current detector 302. Thereby, variation of the sample current is measured with respect to the change of the acceleration voltage. Output data or signal 303 of the measured sample current is supplied to, for example, a computer and so on, and is processed in accordance with the necessity of display, analysis and so on.

In the electron gun of the cold field emission type used in the second embodiment, that is, in the field emission gun, energy width of electrons emitted from the electron gun is narrow, that is, the energy distribution of electrons emitted from the electron gun is sharp. Therefore, the apparatus of the second embodiment is quite suitable for performing analysis in which energy resolution is considered to be most important. On the other hand, quantity of electrons emitted from the electron gun of the cold field emission type is relatively small and sensitivity of analysis becomes low.

Such disadvantage can be suitably improved by using the electron gun of the thermal field emission type, that is, the Schottky emission electron gun, used in the apparatus of the third embodiment. In the electron gun of the thermal field emission type, energy width of electrons emitted from the electron gun is a little broader than that of the electron gun of the cold field emission type, but is much narrower than that of the thermal filament type. Also, quantity of electrons emitted from the electron gun of the thermal field emission type is approximately the same as that emitted from the electron gun of the thermal filament type. Therefore, by using the electron gun of the thermal field emission type, as mentioned in the third embodiment, high sensitivity and high energy resolution of analysis can be realized together.

Embodiment 4

Figure 4:
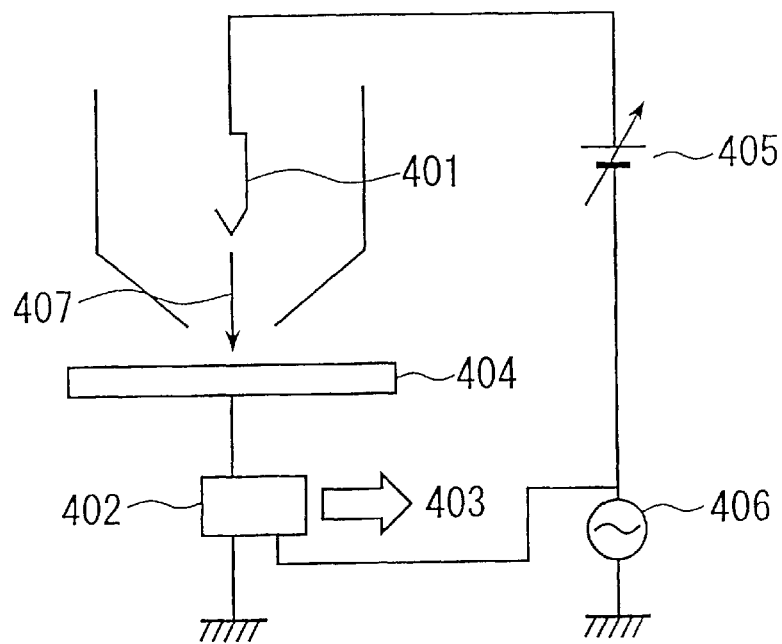
FIG. 4 is a conceptual view illustrating a sample current spectroscopy type surface measurement apparatus according to a fourth embodiment of the present invention.

FIG. 4 is a conceptual view illustrating a sample current spectroscopy type surface measurement apparatus according to a fourth embodiment of the present invention. This apparatus comprises an electron gun 401 which can emit an electron beam onto a sample 404. This apparatus also comprises a variable voltage source 405 which is coupled, for example, between the electron gun 401 and the ground and which supplies an acceleration voltage to the electron gun 401. Also, there is provided a lock-in amplifier 402 for detecting a sample current, for example, a current from the sample 404 to the ground, and a sinusoidal voltage generator 406 for generating a sinusoidal voltage superimposed onto the acceleration voltage generated by the variable voltage source 405.

In this apparatus, the electron beam 406 emitted from the electron gun 401 is irradiated onto the sample 404. In this embodiment, the electron gun 401 is constituted by an electron source of thermal field emission type which uses tungsten as a material thereof. That is, the electron gun 401 is a Schottky emission electron gun. Therefore, there is also provided a power source not shown in the drawing to supply a heating current to the electron gun 401. By irradiating electron beam onto the sample 404 from such electron gun 401, a current flows inside the sample 404. Quantity of current of such sample current is measured by the lock-in amplifier 402.

In the fourth embodiment, an acceleration energy of electrons irradiated from the electron gun 401 is changed by changing the acceleration voltage of electrons by using the variable voltage source 105, while superimposing the sinusoidal wave signal generated by the sinusoidal voltage generator 406 onto the acceleration voltage. For example, the sinusoidal wave signal has an amplitude of 1 electron volts (eV) and a frequency of 6500 Hz. The acceleration energy of electrons is changed, for example, within a range from 10 through 5000 eV. While changing the acceleration voltage, variation of the sample current is detected by the lock-in amplifier 402 which uses a signal of 6500 Hz obtained from the sinusoidal voltage generator 406 as an external control signal. Thereby, variation of the sample current is measured with respect to the change of the acceleration voltage at a high sensitivity. Output data or signal 403 of the measured sample current from the lock-in amplifier 402 is supplied to, for example, a computer and so on, and is processed in accordance with the necessity of display, analysis and so on.

Depending on an object of analysis, a condition of analysis and so on, it is often necessary to measure sample current at a high sensitivity. In such case, it is advantageous to innovate a measurement utilizing a lock-in amplifier having a function of selective amplification. Also, by detecting only AC components of the sample current by using the lock-in amplifier 402, variation of the sample current with respect to variation of the acceleration voltage, that is, differential values of the sample current can be easily obtained.

In the first through fourth embodiments mentioned above, it is possible to inspect averaged crystal information of a relatively large area of a sample surface. On the other hand, it is often required to inspect crystallinity of a local area of a sample surface. In such case, it is possible to focus an electron beam emitted from an electron gun by using an electron lens and so on, and to irradiate a focused electron beam onto a region on a sample in which crystallinity is to be inspected. Also, acceleration voltage of the electrons to be irradiated is changed, and variation of a sample current is measured with respect to the variation of the acceleration voltage. By such measurement, crystallinity of a local area of a particular portion of the sample surface can be inspected. Embodiments of the invention based on such measurement will now be described below. When an electron beam is focused by using an electron lens and in order to increase quantity of electrons irradiated onto a sample, it is most appropriate to use an electron gun of the thermal field emission type, that is, a Schottky emission gun because of the property of the electron gun. Therefore, in each embodiment mentioned below in which an electron beam is focused by using an electron lens, an electron gun of the thermal field emission type is used.

Embodiment 5

Figure 5:
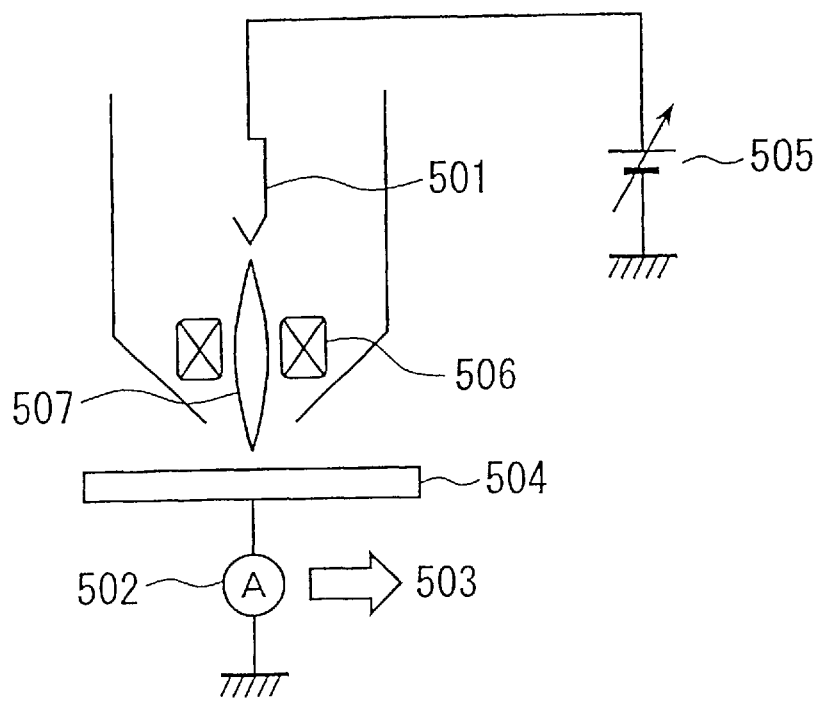
FIG. 5 is a conceptual view illustrating a sample current spectroscopy type surface measurement apparatus according to a fifth embodiment of the present invention.

FIG. 5 is a conceptual view illustrating a sample current spectroscopy type surface measurement apparatus according to a fifth embodiment of the present invention. This apparatus comprises an electron gun 501 which can emit an electron beam onto a sample 504, and an electron lens 506 which is disposed between the electron gun 501 and the sample and which focuses the electron beam emitted from the electron gun 501. This apparatus also comprises a variable voltage source 505 which is coupled, for example, between the electron gun 501 and the ground and which supplies an acceleration voltage to the electron gun 501, and a current detector 502 for detecting a sample current, for example, a current from the sample 504 to the ground.

In this apparatus, the electron beam 507 emitted from the electron gun 501 is focused by the electron lens 506 and irradiated onto the sample 504. In this embodiment, the electron gun 501 is constituted by an electron source of thermal field emission type which uses tungsten as a material thereof. That is, the electron gun 501 is a Schottky emission electron gun. By irradiating electron beam onto the sample 504 from such electron gun 501, a current flows inside the sample 504. Quantity of current of such sample current is measured by the current detector 502 for detecting sample current.

In the fifth embodiment, acceleration energy of electrons irradiated from the electron gun 501 is changed by changing the acceleration voltage of electrons by using the variable voltage source 505. The acceleration energy of electrons is changed, for example, within a range from 10 through 5000 electron volts (eV). While changing the acceleration voltage, the sample current is measured by the current detector 502. Thereby, variation of the sample current is measured with respect to the change of the acceleration voltage. Output data or signal 503 of the measured sample current is supplied to, for example, a computer and so on, and is processed in accordance with the necessity of display, analysis and so on.

Embodiment 6

Figure 6:
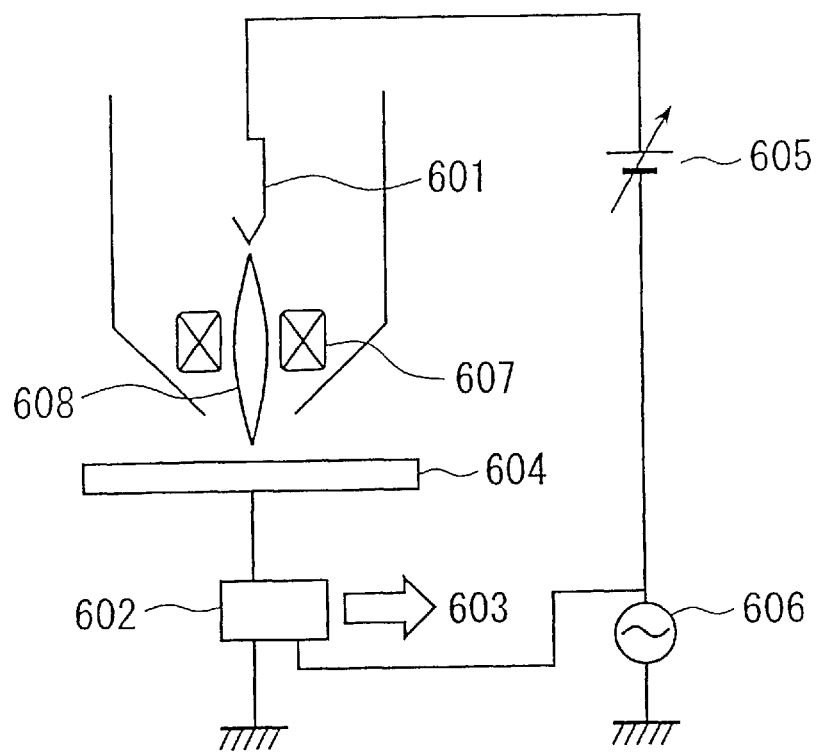
FIG. 6 is a conceptual view illustrating a sample current spectroscopy type surface measurement apparatus according to a sixth embodiment of the present invention.

FIG. 6 is a conceptual view illustrating a sample current spectroscopy type surface measurement apparatus according to a sixth embodiment of the present invention. This apparatus comprises an electron gun 601 which can emit an electron beam onto a sample 604, and an electron lens 606 which is disposed between the electron gun 601 and the sample 604 and which focuses the electron beam emitted from the electron gun 601. This apparatus also comprises a variable voltage source 605 which is coupled, for example, between the electron gun 601 and the ground and which supplies an acceleration voltage to the electron gun 601. Also, there is provided a lock-in amplifier 602 for detecting a sample current, for example, a current from the sample 604 to the ground, and a sinusoidal voltage generator 606 inserted into a connection between the variable voltage source 605 and the ground for generating a sinusoidal voltage superimposed onto the acceleration voltage generated by the variable voltage source 605.

In this apparatus, the electron beam 608 emitted from the electron gun 601 is focused by the electron lens 607 and irradiated onto the sample 604. In this embodiment, the electron gun 601 is composed of an electron source of thermal field emission type which uses tungsten as a material thereof. That is, the electron gun 601 is a Schottky emission electron gun. By irradiating electron beam onto the sample 604 from such electron gun 601, a current flows inside the sample 604. Quantity of current of such sample current is measured by the lock-in amplifier 602.

In the sixth embodiment, an acceleration energy of electrons irradiated from the electron gun 601 is changed by changing the acceleration voltage of electrons by using the variable voltage source 605, while superimposing the sinusoidal wave signal generated by the sinusoidal voltage generator 606 onto the acceleration voltage. For example, the sinusoidal wave signal has an amplitude of 1 electron volts (eV) and a frequency of 6500 Hz. The acceleration energy of electrons is changed, for example, within a range from 10 through 5000 eV. The acceleration voltage is thus changed and variation of the sample current is detected by the lock-in amplifier 602 which uses a signal of 6500 Hz obtained from the sinusoidal voltage generator 606 as an external control signal. Thereby, variation of the sample current is measured with respect to the change of the acceleration voltage at a high sensitivity. Output data or signal 603 of the measured sample current from the lock-in amplifier 602 is supplied to, for example, a computer and so on, and is processed in accordance with the necessity of display, analysis and so on.

Depending on an object of analysis, a condition of analysis and so on, it is often necessary to measure sample current at a high sensitivity. In such case, it is advantageous to innovate a measurement utilizing a lock-in amplifier having a function of selective amplification. Also, by detecting only AC components of the sample current by using the lock-in amplifier 602, variation of the sample current with respect to variation of the acceleration voltage, that is, differential values of the sample current can be easily obtained.

In the fifth and sixth embodiments mentioned above, an electron beam is focused by the electron lens and, thereby, crystallinity of a particular local portion of the sample surface can be inspected. On the other hand, it is sometimes required to inspect a spatial distribution, such as a two dimensional distribution, of a crystallinity of a sample surface. In such case, it is possible to focus and scan an electron beam emitted from an electron gun in an area where crystallinity is to be inspected. Scanning of an electron beam emitted from the electron gun can be performed before focusing the electron beam, or can be performed after focusing the electron beam. In each of measurement points scanned, an acceleration voltage of electrons to be irradiated is changed, and variation of sample current is measured with respect to the change of the acceleration voltage. By such measurement, it is possible to inspect a two dimensional distribution of crystallinity of the sample surface. Embodiments using such measurement will be described below.

Embodiment 7

Figure 7:
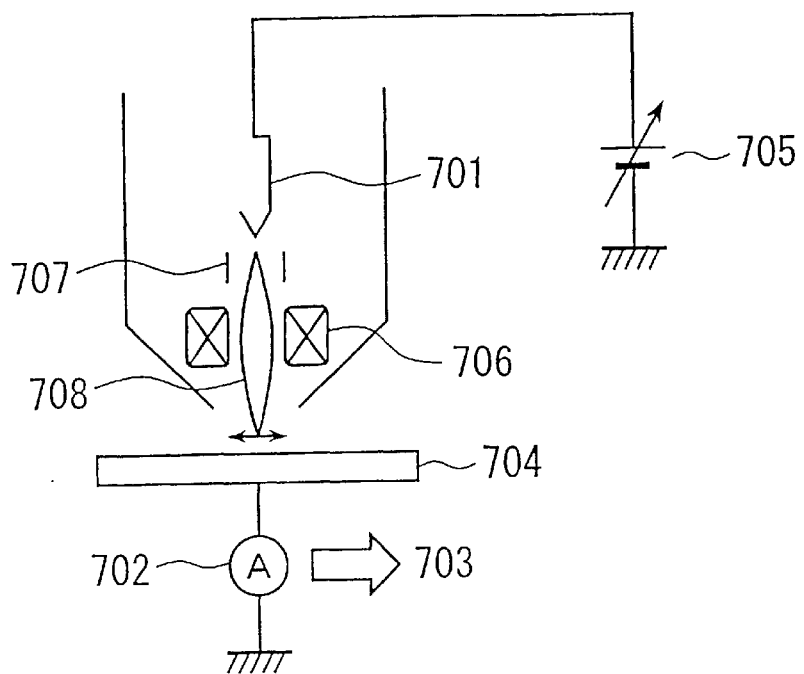
FIG. 7 is a conceptual view illustrating a sample current spectroscopy type surface measurement apparatus according to a seventh embodiment of the present invention.

FIG. 7 is a conceptual view illustrating a sample current spectroscopy type surface measurement apparatus according to a seventh embodiment of the present invention. This apparatus comprises an electron gun 701 which can emit an electron beam onto a sample 704, and an electron lens 706 which is disposed between the electron gun 701 and the sample and which focuses the electron beam emitted from the electron gun 701. This apparatus also comprises a variable voltage source 705 which is coupled, for example, between the electron gun 701 and the ground and which supplies an acceleration voltage to the electron gun 701, and a current detector 702 for detecting a sample current, for example, a current from the sample 704 to the ground. Further, there is provided scanning electrodes or deflection electrodes 707 as a means for scanning the electron beam 708 emitted from the electron gun 701. The scanning electrodes 707 are disposed, for example, between the electron gun 701 and the electron lens 706. However, the scanning electrodes 707 can also be disposed between the electron lens 706 and the sample 704. Also, it is possible to use other scanning means, such as electromagnetic coils and so on.

In this apparatus, the electron beam 708 emitted from the electron gun 701 is focused by the electron lens 706 and irradiated onto the sample 704. Also, by the scanning electrodes 707, the electron beam 708 is scanned on the sample 704. In this embodiment, the electron gun 701 is constituted by an electron source of thermal field emission type which uses tungsten as a material thereof. That is, the electron gun 701 is a Schottky emission electron gun. By irradiating electron beam onto the sample 704 from such electron gun 701, a current flows inside the sample 704. Quantity of current of such sample current is measured by the current detector 702 for detecting sample current.

In the seventh embodiment, while the electron beam is irradiated on a measurement point within a scanning range on the sample surface, acceleration energy of electrons irradiated from the electron gun 701 is changed by changing the acceleration voltage of electrons by using the variable voltage source 705. The acceleration energy of electrons is changed, for example, within a range from 10 through 5000 electron volts (eV). While changing the acceleration voltage, the sample current is measured by the current detector 702. Thereby, variation of the sample current is measured with respect to the change of the acceleration voltage. Thereafter, an irradiation position of the electron beam is moved to a next measurement point on the sample surface, and the acceleration voltage of electrons is changed similarly to the above. Variation of sample current is measured by the current detector 702 with respect to the change of the acceleration voltage. Such measurement is performed in each of the measurement points on the sample surface. Output data or signal 703 of the measured sample current in each measurement point is supplied to, for example, a computer and so on, and is processed in accordance with the necessity of display, analysis and so on.

Embodiment 8

Figure 8:
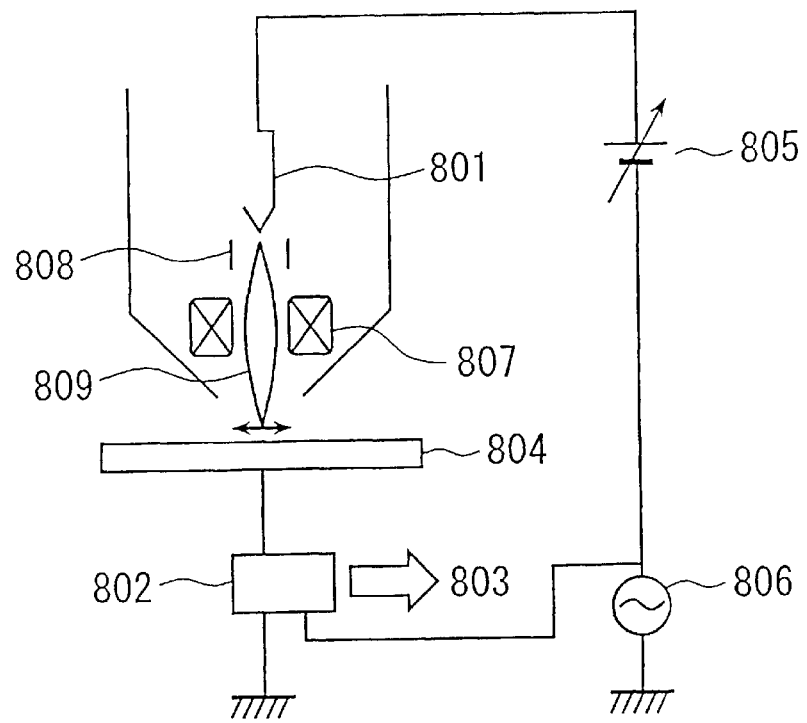
FIG. 8 is a conceptual view illustrating a sample current spectroscopy type surface measurement apparatus according to an eighth embodiment of the present invention.

FIG. 8 is a conceptual view illustrating a sample current spectroscopy type surface measurement apparatus according to a seventh embodiment of the present invention. This apparatus comprises an electron gun 801 which can emit an electron beam onto a sample 804, and an electron lens 807 which is disposed between the electron gun 801 and the sample and which focuses the electron beam emitted from the electron gun 801. This apparatus also comprises a variable voltage source 805 which is coupled, for example, between the electron gun 801 and the ground and which supplies an acceleration voltage to the electron gun 801. Also, there is provided a lockin amplifier 802 for detecting a sample current, for example, a current from the sample 804 to the ground, and a sinusoidal voltage generator 806 inserted into a connection between the variable voltage source 805 and the ground for generating a sinusoidal voltage superimposed onto the acceleration voltage generated by the variable voltage source 805. Further, there is provided scanning electrodes or deflection electrodes 808 as a means for scanning the electron beam 809 emitted from the electron gun 801. The scanning electrodes 808 are disposed, for example, between the electron gun 801 and the electron lens 806. However, the scanning electrodes 808 can also be disposed between the electron lens 806 and the sample 804. Also, it is possible to use other scanning means, such as electromagnetic coils and so on.

In this apparatus, the electron beam 809 emitted from the electron gun 801 is focused by the electron lens 806 and irradiated onto the sample 804. Also, by the scanning electrodes 808, the electron beam 809 is scanned on the sample 804. In this embodiment, the electron gun 801 is constituted by an electron source of thermal field emission type which uses tungsten as a material thereof. That is, the electron gun 801 is a Schottky emission electron gun. By irradiating electron beam onto the sample 804 from such electron gun 801, a current flows inside the sample 804. Quantity of current of such sample current is measured by the lock-in amplifier 802 for detecting sample current.

In the eighth embodiment, while the electron beam is irradiated on a measurement point within a scanning range on the sample surface, acceleration energy of electrons irradiated from the electron gun 801 is changed by changing the acceleration voltage of electrons by using the variable voltage source 805, while superimposing the sinusoidal wave signal generated by the sinusoidal voltage generator 806 onto the acceleration voltage. For example, the sinusoidal wave signal has an amplitude of 1 electron volts (eV) and a frequency of 6500 Hz. The acceleration energy of electrons is changed, for example, within a range from 10 through 5000 electron volts (eV). The acceleration voltage is thus changed and the sample current is measured by the lock-in amplifier 802 which uses a signal of 6500 Hz obtained from the sinusoidal voltage generator 606 as an external control signal. Thereby, variation of the sample current is measured with respect to the change of the acceleration voltage. Thereafter, an irradiation position of the electron beam is moved to a next measurement point on the sample surface, and the acceleration voltage of electrons is changed similarly to the above. Variation of sample current is measured by the lock-in amplifier 802 with respect to the change of the acceleration voltage. Such measurement is performed in each of the measurement points on the sample surface. Output data or signal 803 of the measured sample current in each measurement point is supplied to, for example, a computer and so on, and is processed in accordance with the necessity of display, analysis and so on.

Depending on an object of analysis, a condition of analysis and so on, it is often necessary to measure sample current at a high sensitivity. In such case, it is advantageous to innovate a measurement utilizing a lock-in amplifier having a function of selective amplification. Also, by detecting only AC components of the sample current by using the lock-in amplifier 802, variation of the sample current with respect to variation of the acceleration voltage, that is, differential values of the sample current can be easily obtained.

In order to correctly and quantitatively measure variation of a sample current, it is also required to measure a quantity of an electron beam irradiated from an electron gun to a sample, that is, a current value of an incident electron beam, correctly and quantitatively. The current value of the incident electron beam varies depending on an acceleration voltage, but does not increase completely linearly with respect to the increase in the acceleration voltage. The current value of the incident electron beam can be measured correctly by using a Faraday cup. Therefore, it is possible to previously obtain a relation between the current value of the incident electron beam and the acceleration voltage by using the Faraday cup, and, by using the relation, to normalize or standardize and to calibrate a current value when a sample current is measured. Thereby, it is possible not only to obtain variation of the sample current when the acceleration voltage is changed, but also to obtain variation of a proportion of sample current to the current value of the incident electron beam when the acceleration voltage is changed. Embodiments utilizing such method will be described below.

Embodiment 9

Figure 9:
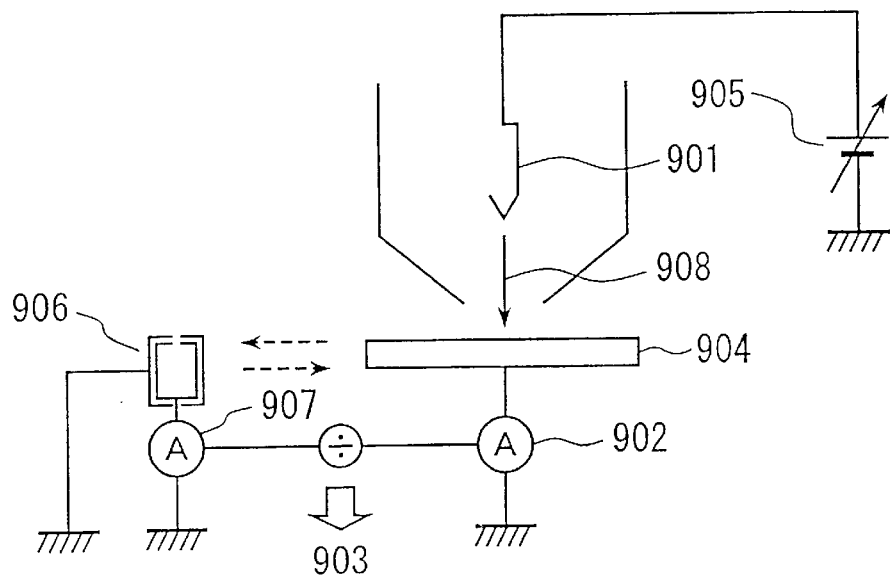
FIG. 9 is a conceptual view illustrating a sample current spectroscopy type surface measurement apparatus according to a ninth embodiment of the present invention.

FIG. 9 is a conceptual view illustrating a sample current spectroscopy type surface measurement apparatus according to a ninth embodiment of the present invention. This apparatus comprises an electron gun 901 which can emit an electron beam onto a sample 904. This apparatus also comprises a variable voltage source 905 which is coupled, for example, between the electron gun 901 and the ground and which supplies an acceleration voltage to the electron gun 901, and a current detector 902 for detecting a sample current, for example, a current from the sample 904 to the ground. This apparatus further comprises a Faraday cup 906 which can be disposed at the position an electron beam from the electron gun is irradiated in place of the sample 904. Also, there is provided a current detector 907 for calibrating an incident electron beam current.

In this apparatus, the electron beam 908 emitted from the electron gun 901 is irradiated onto the sample 904. In this embodiment, the electron gun 901 is constituted by an electron source of thermal filament type which uses $LaB_6$ as a material thereof That is, the electron gun 901 is a thermoionic electron gun. By irradiating electron beam onto the sample 904 from such electron gun 901, a current flows inside the sample 904. Quantity of current of such sample current is measured by the current detector 902 for detecting sample current.

In the ninth embodiment, acceleration energy of electrons irradiated from the electron gun 901 is changed by changing the acceleration voltage of electrons by using the variable voltage source 905. The acceleration energy of electrons is changed, for example, within a range from 10 through 5000 electron volts (eV). The acceleration voltage is thus changed and the sample current is measured by the current detector 902. Thereby, variation of the sample current is measured with respect to the change of the acceleration voltage. Output data or signal 903 of the measured sample current is supplied to, for example, a computer and so on, and is processed in accordance with the necessity of display, analysis and so on.

In the apparatus of this embodiment, by using the Faraday cup, the relation between the current value of the incident electron beam and the acceleration voltage can be previously obtained and stored. That is, after moving the Faraday cup 906 to the position where an electron beam can be irradiated, the electron beam is emitted from the electron gun 901. The emitted electron beam is irradiated into the Faraday cup 906. The acceleration voltage of the electrons emitted from the electron gun 901 is changed by the variable voltage source 905 under the same condition as that of the sample current measurement, that is, the acceleration energy of electrons is changed, for example, within a range from 10 through 5000 eV. The acceleration voltage is thus changed and the current value of the electron beam incident into the Faraday cup 906 is measured by the current detector 907 for calibrating the incident electron beam current. Data of the current value of the incident electron beam obtained by the current detector 907 together with data of the acceleration voltage are stored, for example, in a storage of a computer not shown in the drawing as a data for current calibration. That is, the relation between the current value of the incident electron beam and the acceleration voltage is correctly obtained and stored. It is preferable to obtain such data for current calibration by using the Faraday cup 906 prior to the measurement of the sample current. When the sample current is measured, the quantitative current value of the incident electron beam at each acceleration voltage is obtained by reading out the current value at the corresponding acceleration voltage from the storage storing the data for current calibration. For example, it is possible to obtain a proportion of the sample current to the current value of the incident electron beam. Therefore, the output 903 of the measured current value obtained by measuring the sample current is normalized or standardized and is calibrated by the corresponding current value of the incident electron beam based on the stored data for current calibration.

Embodiment 10

Figure 10:
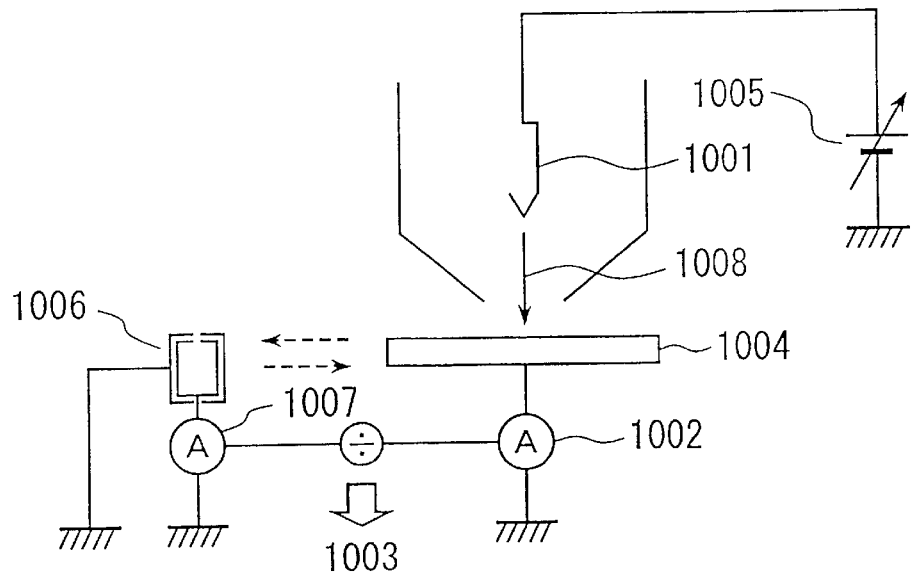
FIG. 10 is a conceptual view illustrating a sample current spectroscopy type surface measurement apparatus according to a tenth embodiment of the present invention.

FIG. 10 is a conceptual view illustrating a sample current spectroscopy type surface measurement apparatus according to a tenth embodiment of the present invention. This apparatus comprises an electron gun 1001 which can emit an electron beam onto a sample 1004. This apparatus also comprises a variable voltage source 1005 which is coupled, for example, between the electron gun 1001 and the ground and which supplies an acceleration voltage to the electron gun 1001, and a current detector 1002 for detecting a sample current, for example, a current from the sample 1004 to the ground. This apparatus further comprises a Faraday cup 1006 which can be disposed at the position an electron beam from the electron gun 1001 is irradiated in place of the sample 1004. Also, there is provided a current detector 1007 for calibrating an incident electron beam current.

In this apparatus, the electron beam 1008 emitted from the electron gun 1001 is irradiated onto the sample 1004. In this embodiment, the electron gun 1001 is constituted by an electron source of cold field emission type which uses tungsten as a material thereof. That is, the electron gun 1001 is a field emission electron gun. By irradiating electron beam onto the sample 1004 from such electron gun 1001, a current flows inside the sample 1004. Quantity of current of such sample current is measured by the current detector 1002 for detecting sample current.

In the tenth embodiment, acceleration energy of electrons irradiated from the electron gun 1001 is changed by changing the acceleration voltage of electrons by using the variable voltage source 1005. The acceleration energy of electrons is changed, for example, within a range from 10 through 5000 electron volts (eV). The acceleration voltage is thus changed and the sample current is measured by the current detector 1002. Thereby, variation of the sample current is measured with respect to the change of the acceleration voltage. Output data or signal 1003 of the measured sample current is supplied to, for example, a computer and so on, and is processed in accordance with the necessity of display, analysis and so on.

In the apparatus of this embodiment, by using the Faraday cup, the relation between the current value of the incident electron beam and the acceleration voltage can be previously obtained and stored. That is, after moving the Faraday cup 1006 to the position where an electron beam can be irradiated, the electron beam is emitted from the electron gun 1001. The emitted electron beam is irradiated into the Faraday cup 1006. The acceleration voltage of the electrons emitted from the electron gun 1001 is changed by the variable voltage source 1005 under the same condition as that of the sample current measurement, that is, the acceleration energy of electrons is changed, for example, within a range from 10 through 5000 eV. The acceleration voltage is thus changed and the current value of the electron beam incident into the Faraday cup 1006 is measured by the current detector 1007 for calibrating the incident electron beam current. Data of the current value of the incident electron beam obtained by the current detector 1007 together with data of the acceleration voltage are stored, for example, in a storage of a computer not shown in the drawing as a data for current calibration. That is, the relation between the current value of the incident electron beam and the acceleration voltage is correctly obtained and stored. It is preferable to obtain such data for current calibration by using the Faraday cup 1006 prior to the measurement of the sample current. When the sample current is measured, the quantitative current value of the incident electron beam at each acceleration voltage is obtained by reading out the current value at the corresponding acceleration voltage from the storage storing the data for current calibration. For example, it is possible to obtain a proportion of the sample current to the current value of the incident electron beam. Therefore, the output 1003 of the measured current value obtained by measuring the sample current is normalized or standardized and is calibrated by the corresponding current value of the incident electron beam based on the stored data for current calibration.

Embodiment 11

Figure 11:
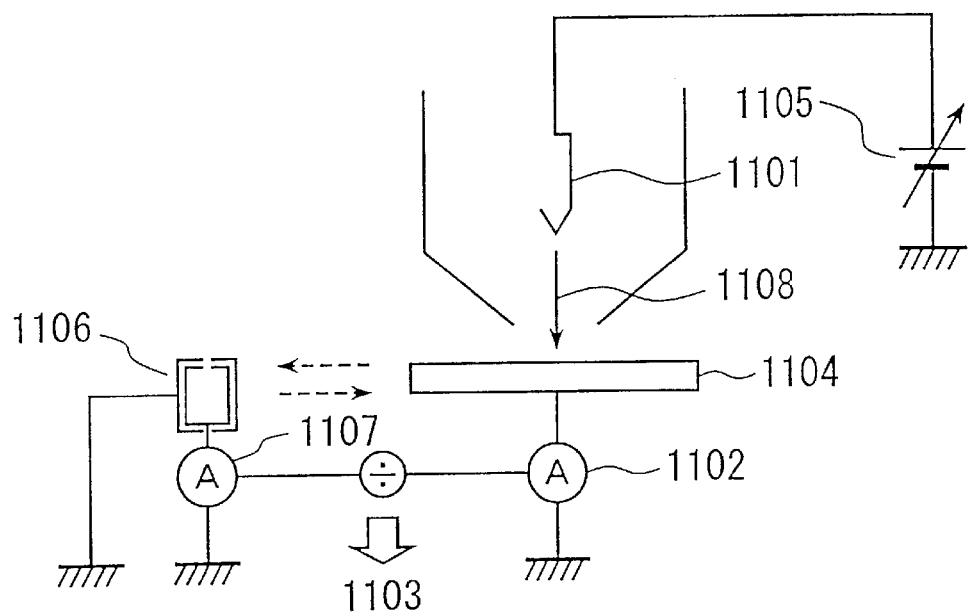
FIG. 11 is a conceptual view illustrating a sample current spectroscopy type surface measurement apparatus according to an eleventh embodiment of the present invention.

FIG. 11 is a conceptual view illustrating a sample current spectroscopy type surface measurement apparatus according to a third embodiment of the present invention. This apparatus comprises an electron gun 1101 which can emit an electron beam onto a sample 1104. This apparatus also comprises a variable voltage source 1105 which is coupled, for example, between the electron gun 1101 and the ground and which supplies an acceleration voltage to the electron gun 1101, and a current detector 1102 for detecting a sample current, for example, a current from the sample 1104 to the ground. This apparatus further comprises a Faraday cup 1106 which can be disposed at the position an electron beam from the electron gun 1101 is irradiated in place of the sample 1104. Also, there is provided a current detector 1107 for calibrating an incident electron beam current.

In this apparatus, the electron beam 1108 emitted from the electron gun 1101 is irradiated onto the sample 1104. In this embodiment, the electron gun 1101 is constituted by an electron source of thermal field emission type which uses tungsten as a material thereof. That is, the electron gun 1101 is a Schottky emission electron gun. By irradiating electron beam onto the sample 1104 from such electron gun 1101, a current flows inside the sample 1104. Quantity of current of such sample current is measured by the current detector 1102 for detecting sample current.

In the eleventh embodiment, acceleration energy of electrons irradiated from the electron gun 1101 is changed by changing the acceleration voltage of electrons by using the variable voltage source 1105. The acceleration energy of electrons is changed, for example, within a range from 10 through 5000 electron volts (eV). The acceleration voltage is thus changed and the sample current is measured by the current detector 1102. Thereby, variation of the sample current is measured with respect to the change of the acceleration voltage. Output data or signal 1103 of the measured sample current is supplied to, for example, a computer and so on, and is processed in accordance with the necessity of display, analysis and so on.

In the apparatus of this embodiment, by using the Faraday cup, the relation between the current value of the incident electron beam and the acceleration voltage can be previously obtained and stored. That is, after moving the Faraday cup 1106 to the position where an electron beam can be irradiated, the electron beam is emitted from the electron gun 1101. The emitted electron beam is irradiated into the Faraday cup 1106. The acceleration voltage of the electrons emitted from the electron gun 1101 is changed by the variable voltage source 1105 under the same condition as that of the sample current measurement, that is, the acceleration energy of electrons is changed, for example, within a range from 10 through 5000 eV. The acceleration voltage is thus changed and the current value of the electron beam incident into the Faraday cup 1106 is measured by the current detector 1107 for calibrating the incident electron beam current. Data of the current value of the incident electron beam obtained by the current detector 1107 together with data of the acceleration voltage are stored, for example, in a storage of a computer not shown in the drawing as a data for current calibration. That is, the relation between the current value of the incident electron beam and the acceleration voltage is correctly obtained and stored. It is preferable to obtain such data for current calibration by using the Faraday cup 1106 prior to the measurement of the sample current. When the sample current is measured, the quantitative current value of the incident electron beam at each acceleration voltage is obtained by reading out the current value at the corresponding acceleration voltage from the storage storing the data for current calibration. For example, it is possible to obtain a proportion of the sample current to the current value of the incident electron beam. Therefore, the output 1103 of the measured current value obtained by measuring the sample current is normalized or standardized and is calibrated by the corresponding current value of the incident electron beam based on the stored data for current calibration.

Embodiment 12

Figure 12:
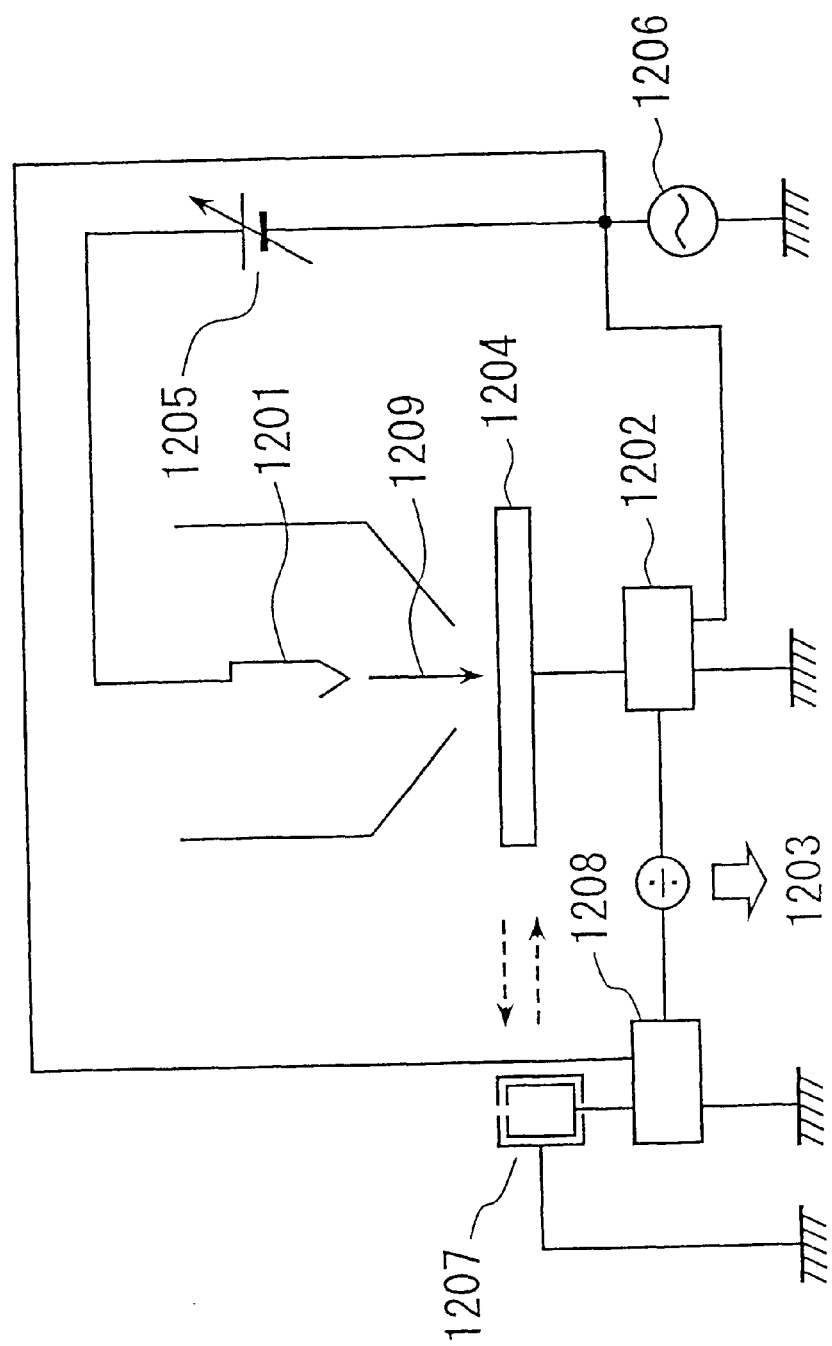
FIG. 12 is a conceptual view illustrating a sample current spectroscopy type surface measurement apparatus according to a twelfth embodiment of the present invention.

FIG. 12 is a conceptual view illustrating a sample current spectroscopy type surface measurement apparatus according to a twelfth embodiment of the present invention. This apparatus comprises an electron gun 1201 which can emit an electron beam onto a sample 1204. This apparatus also comprises a variable voltage source 1205 which is coupled, for example, between the electron gun 1201 and the ground and which supplies an acceleration voltage to the electron gun 1201. Also, there is provided a lock-in amplifier 1202 for detecting a sample current, for example, a current from the sample 1204 to the ground, and a sinusoidal voltage generator 1206 for generating a sinusoidal voltage superimposed onto the acceleration generated by the variable voltage source 1205. This apparatus further comprises a Faraday cup 1207 which can be disposed at the position an electron beam from the electron gun 1201 is irradiated in place of the sample 1204. Also, there is provided a lock-in amplifier 1208 for calibrating an incident electron beam current.

In this apparatus, the electron beam 1209 emitted from the electron gun 1201 is irradiated onto the sample 1204. In this embodiment, the electron gun 1201 is constituted by an electron source of thermal field emission type which uses tungsten as a material thereof. That is, the electron gun 1201 is a Schottky emission electron gun. By irradiating electron beam onto the sample 1204 from such electron gun 1201, a current flows inside the sample 1204. Quantity of current of such sample current is measured by the lock-in amplifier 1202.

In the fourth embodiment, an acceleration energy of electrons irradiated from the electron gun 1201 is changed by changing the acceleration voltage of electrons by using the variable voltage source 1205, while superimposing the sinusoidal wave signal generated by the sinusoidal voltage generator 1206 onto the acceleration voltage. For example, the sinusoidal wave signal has an amplitude of 1 electron volts (eV) and a frequency of 6500 Hz. The acceleration energy of electrons is changed, for example, within a range from 10 through 5000 eV. The acceleration voltage is thus changed and variation of the sample current is detected by the lock-in amplifier 1202 which uses a signal of 6500 Hz obtained from the sinusoidal voltage generator 1206 as an external control signal. Thereby, variation of the sample current is measured with respect to the change of the acceleration voltage at a high sensitivity. Output data or signal 1203 of the measured sample current from the lock-in amplifier 1202 is supplied to, for example, a computer and so on, and is processed in accordance with the necessity of display, analysis and so on.

In the apparatus of this embodiment, by using the Faraday cup, the relation between the current value of the incident electron beam and the acceleration voltage can be previously obtained and stored. That is, after moving the Faraday cup 1207 to the position where an electron beam can be irradiated, the electron beam is emitted from the electron gun 1201. The emitted electron beam is irradiated into the Faraday cup 1207. The acceleration voltage of the electrons emitted from the electron gun 1201 is changed by the variable voltage source 1205 under the same condition as that of the sample current measurement, that is, the acceleration energy of electrons is changed, for example, within a range from 10 through 5000 eV, while superimposing the sinusoidal wave signal generated by the sinusoidal voltage generator 1206 onto the acceleration voltage. For example, the sinusoidal wave signal has an amplitude of 1 electron volts (eV) and a frequency of 6500 Hz. The acceleration voltage is thus changed and variation of the current value of the electron beam incident into the Faraday cup 1207 is detected by the lock-in amplifier 1208 which uses a signal of 6500 Hz obtained from the sinusoidal voltage generator 1206 as an external control signal. Data of the current value of the incident electron beam obtained by the lock-in amplifier 1208 together with data of the acceleration voltage and so on are stored, for example, in a storage of a computer not shown in the drawing as a data for current calibration. That is, the relation between the current value of the incident electron beam and the acceleration voltage is correctly obtained and stored. It is preferable to obtain such data for current calibration by using the Faraday cup 1207 prior to the measurement of the sample current. When the sample current is measured, the quantitative current value of the incident electron beam at each acceleration voltage is obtained by reading out the current value at the corresponding acceleration voltage from the storage storing the data for current calibration. For example, it is possible to obtain a proportion of the sample current to the current value of the incident electron beam. Therefore, the output 1203 of the measured current value obtained by measuring the sample current is normalized or standardized and is calibrated by the corresponding current value of the incident electron beam based on the stored data for current calibration. In the present embodiment in which the sample current is measured by the lock-in amplifier having a function of selective amplification and in which the current value of the incident electron beam is calibrated by using the Faraday cup, it is preferable to perform both the measurement of the sample current and the measurement of the current value of the incident electron beam by the Faraday cup in the same condition.

In the ninth through twelfth embodiments mentioned above, it is possible to calibrate the current value of the incident electron beam, that is, to quantitatively obtain the current value of the incident electron beam, and thereafter to inspect averaged crystal information of a relatively large area of a sample surface. On the other hand, it is often required to inspect crystallinity of a local area of a sample surface. In such case, it is possible to focus an electron beam emitted from an electron gun by using an electron lens and so on, and to irradiate a focused electron beam onto a region on a sample in which crystallinity is to be inspected. Also, acceleration voltage of the electrons to be irradiated is changed, and variation of a sample current is measured with respect to the variation of the acceleration voltage. Further, the current value of the incident electron beam used for calibration is measured by irradiating an electron beam onto the Faraday cup in the same condition as that of the sample current measurement. By these measurements, the current value of the incident electron beam can be calibrated and crystallinity of a local area of a particular portion of the sample surface can be inspected. Embodiments of the invention based on such measurements will now be described below. When an electron beam is focused by using an electron lens and in order to increase quantity of electrons irradiated onto a sample, it is most appropriate to use an electron gun of the thermal field Ad emission type, that is, a Schottky emission gun because of the property of the electron gun. Therefore, in each embodiment mentioned below in which an electron beam is focused by using an electron lens, an electron gun of the thermal field emission type is used.

Embodiment 13

Figure 13:
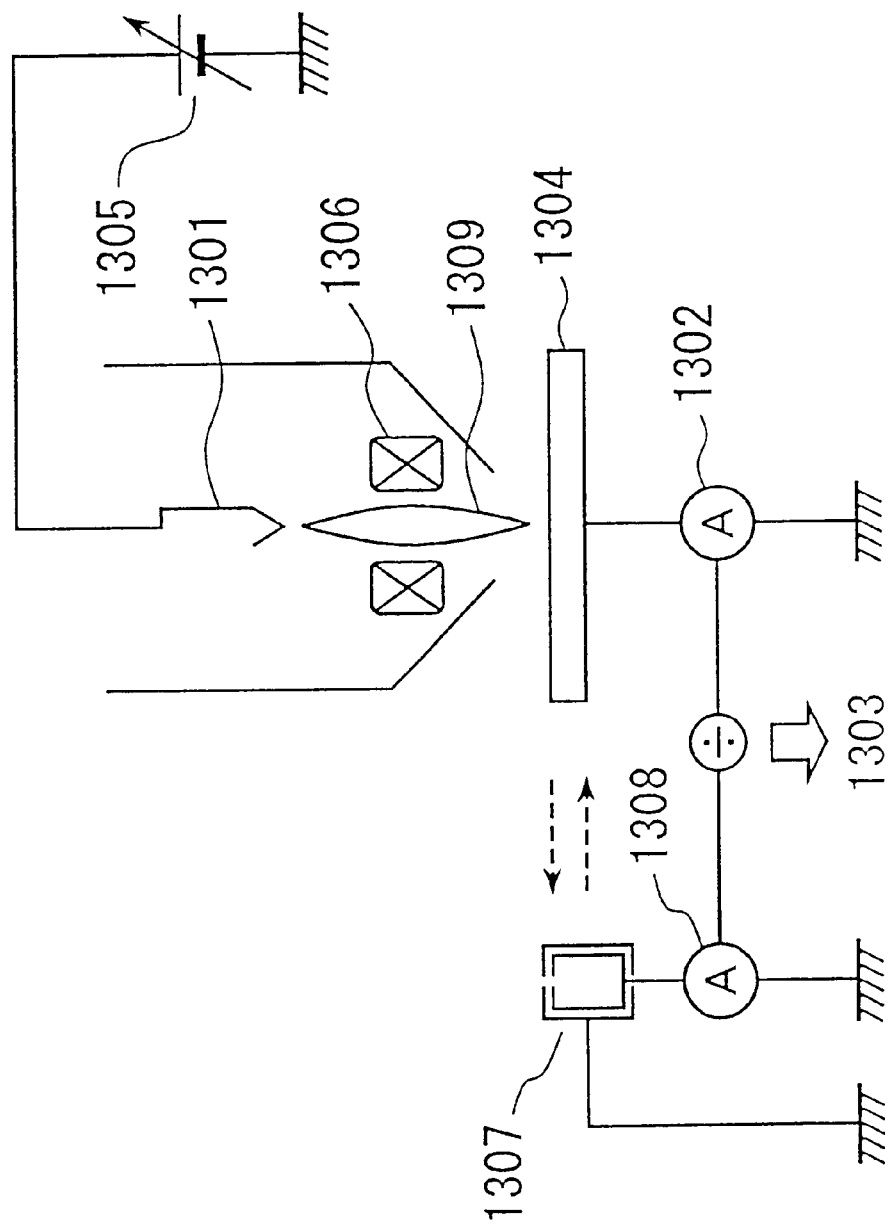
FIG. 13 is a conceptual view illustrating a sample current spectroscopy type surface measurement apparatus according to a thirteenth embodiment of the present invention.

FIG. 13 is a conceptual view illustrating a sample current spectroscopy type surface measurement apparatus according to a thirteenth embodiment of the present invention. This apparatus comprises an electron gun 1301 which can emit an electron beam onto a sample 1304, and an electron lens 1306 which is disposed between the electron gun 1301 and the sample and which focuses the electron beam emitted from the electron gun 1301. This apparatus also comprises a variable voltage source 1305 which is coupled, for example, between the electron gun 1301 and the ground and which supplies an acceleration voltage to the electron gun 1301, and a current detector 1302 for detecting a sample current, for example, a current from the sample 1304 to the ground. This apparatus further comprises a Faraday cup 1307 which can be disposed at the position an electron beam from the electron gun 1301 is irradiated in place of the sample 1304. Also, there is provided a current detector 1308 for calibrating an incident electron beam current.

In this apparatus, the electron beam 1309 emitted from the electron gun 1301 is focused by the electron lens 1306 and irradiated onto the sample 1304. In this embodiment, the electron gun 1301 is constituted by an electron source of thermal field emission type which uses tungsten as a material thereof. That is, the electron gun 1301 is a Schottky emission electron gun. By irradiating electron beam onto the sample 1304 from such electron gun 1301, a current flows inside the sample 1304. Quantity of current of such sample current is measured by the current detector 1302 for detecting sample current.

In the thirteenth embodiment, acceleration energy of electrons irradiated from the electron gun 1301 is changed by changing the acceleration voltage of electrons by using the variable voltage source 1305. The acceleration energy of electorns is changed, for example, within a range from 10 through 5000 electron volts (eV). The acceleration voltage is thus changed and the sample current is measured by the current detector 1302. Thereby, variation of the sample current is measured with respect to the change of the acceleration voltage. Output data or signal 1303 of the measured sample current is supplied to, for example, a computer and so on, and is processed in accordance with the necessity of display, analysis and so on.

In the apparatus of this embodiment, the relation between the current value of the incident electron beam and the acceleration voltage can be previously obtained and stored. That is, after moving the Faraday cup 1307 to the position where an electron beam can be irradiated, the electron beam is emitted from the electron gun 1301. The emitted electron beam is focused by the electron lens 1306 and is all irradiated into the Faraday cup 1307. The acceleration voltage of the electrons emitted from the electron gun 1301 is changed by the variable voltage source 1305 under the same condition as that of the sample current measurement, that is, the acceleration energy of electrons is changed, for example, within a range from 10 through 5000 eV. The acceleration voltage is thus changed and the current value of the electron beam incident into the Faraday cup 1307 is measured by the current detector 1308 for calibrating the incident electron beam current. Data of the current value of the incident electron beam obtained by the current detector 1308 together with data of the acceleration voltage are stored, for example, in a storage of a computer not shown in the drawing as a data for current calibration. That is, the relation between the current value of the incident electron beam and the acceleration voltage is correctly obtained and stored. It is preferable to obtain such data for current calibration by using the Faraday cup 1307 prior to the measurement of the sample current. When the sample current is measured, the quantitative current value of the incident electron beam at each acceleration voltage is obtained by reading out the current value at the corresponding acceleration voltage from the storage storing the data for current calibration. For example, it is possible to obtain a proportion of the sample current to the current value of the incident electron beam. Therefore, the output 1303 of the measured current value obtained by measuring the sample current is normalized or standardized and is calibrated by the corresponding current value of the incident electron beam based on the stored data for current calibration.

Embodiment 14

Figure 14:
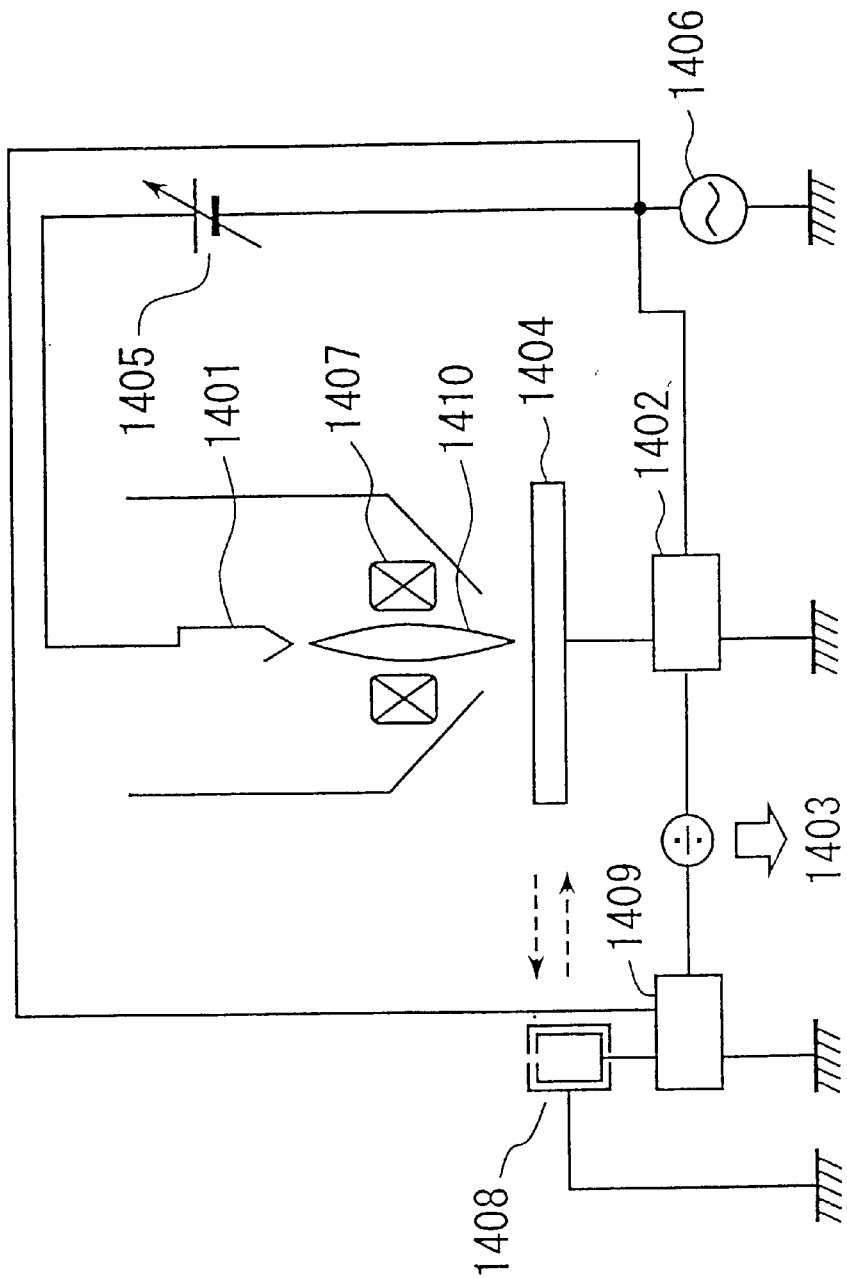
FIG. 14 is a conceptual view illustrating a sample current spectroscopy type surface measurement apparatus according to a fourteenth embodiment of the present invention.

FIG. 14 is a conceptual view illustrating a sample current spectroscopy type surface measurement apparatus according to a fourteenth embodiment of the present invention. This apparatus comprises an electron gun 1401 which can emit an electron beam onto a sample 1404, and an electron lens 1407 which is disposed between the electron gun 1401 and the sample 1404 and which focuses the electron beam emitted from the electron gun 1401. This apparatus also comprises a variable voltage source 1405 which is coupled, for example, between the electron gun 1401 and the ground and which supplies an acceleration voltage to the electron gun 1401. Also, there is provided a lock-in amplifier 1402 for detecting a sample current, for example, a current from the sample 1404 to the ground, and a sinusoidal voltage generator 1406 inserted into a connection between the variable voltage source 1405 and the ground for generating a sinusoidal voltage superimposed onto the acceleration voltage generated by the variable voltage source 1405. This apparatus further comprises a Faraday cup 1408 which can be disposed at the position an electron beam from the electron gun 1401 is irradiated in place of the sample 1404. Also, there is provided a lock-in amplifier 1409 for calibrating an incident electron beam current.

In this apparatus, the electron beam 1410 emitted from the electron gun 1401 is focused by the electron lens 1407 and irradiated onto the sample 1404. In this embodiment, the electron gun 1401 is composed of an electron source of thermal field emission type which uses tungsten as a material thereof. That is, the electron gun 1401 is a Schottky emission electron gun. By irradiating electron beam onto the sample 1404 from such electron gun 1401, a current flows inside the sample 1404. Quantity of current of such sample current is measured by the lock-in amplifier 1402.

In the fourteenth embodiment, an acceleration energy of electrons irradiated from the electron gun 1401 is changed by changing the acceleration voltage of electrons by using the variable voltage source 1405, while superimposing the sinusoidal wave signal generated by the sinusoidal voltage generator 1406 onto the acceleration voltage. For example, the sinusoidal wave signal has an amplitude of 1 electron volts (eV) and a frequency of 6500 Hz. The acceleration energy of electrons is changed, for example, within a range from 10 through 5000 eV. The acceleration voltage is thus changed and variation of the sample current is detected by the lock-in amplifier 1402 which uses a signal of 6500 Hz obtained from the sinusoidal voltage generator 1406 as an external control signal. Thereby, variation of the sample current is measured with respect to the change of the acceleration voltage at a high sensitivity. Output data or signal 1403 of the measured sample current from the lock-in amplifier 1402 is supplied to, for example, a computer and so on, and is processed in accordance with the necessity of display, analysis and so on.

In the apparatus of this embodiment, the relation between the current value of the incident electron beam and the acceleration voltage can be previously obtained and stored. That is, after moving the Faraday cup 1408 to the position where an electron beam can be irradiated, the electron beam is emitted from the electron gun 1401. The emitted electron beam is irradiated into the Faraday cup 1408. The acceleration voltage of the electrons emitted from the electron gun 1401 is changed by the variable voltage source 1405 under the same condition as that of the sample current measurement, that is, the acceleration energy of electrons is changed, for example, within a range from 10 through 5000 eV, while superimposing the sinusoidal wave signal generated by the sinusoidal voltage generator 1406 onto the acceleration voltage. For example, the sinusoidal wave signal has an amplitude of 1 electron volts (eV) and a frequency of 6500 Hz. The acceleration voltage is thus changed and variation of the current value of the electron beam incident into the Faraday cup 1408 is detected by the lock-in amplifier 1409 which uses a signal of 6500 Hz obtained from the sinusoidal voltage generator 1406 as an external control signal. Data of the current value of the incident electron beam obtained by the lock-in amplifier 1409 together with data of the acceleration voltage and so on are stored, for example, in a storage of a computer not shown in the drawing as a data for current calibration. That is, the relation between the current value of the incident electron beam and the acceleration voltage is correctly obtained and stored. It is preferable to obtain such data for current calibration by using the Faraday cup 1408 prior to the measurement of the sample current. When the sample current is measured, the quantitative current value of the incident electron beam at each acceleration voltage is obtained by reading out the current value at the corresponding acceleration voltage from the storage storing the data for current calibration. For example, it is possible to obtain a proportion of the sample current to the current value of the incident electron beam. Therefore, the output 1403 of the measured current value obtained by measuring the sample current is normalized or standardized and is calibrated by the corresponding current value of the incident electron beam based on the stored data for current calibration. In the present embodiment in which the sample current is measured by the lock-in amplifier having a function of selective amplification and in which the current value of the incident electron beam is calibrated by using the Faraday cup, it is preferable to perform both the measurement of the sample current and the measurement of the current value of the incident electron beam by the Faraday cup in the same condition.

In the thirteenth and fourteenth embodiments mentioned above, an electron beam is focused by the electron lens and, thereby crystallinity of a particular local portion of the sample surface can be inspected. On the other hand, it is sometimes required to inspect a spatial distribution, such as a two dimensional distribution, of a crystallinity of a sample surface. In such case, it is possible to focus and scan an electron beam emitted from an electron gun in an area where crystallinity is to be inspected. Scanning of an electron beam emitted from the electron gun can be performed before focusing the electron beam, or can be performed after focusing the electron beam. In each of measurement points scanned, an acceleration voltage of electrons to be irradiated is changed, and variation of sample current is measured with respect to the change of the acceleration voltage. Further, the current value of the incident electron beam used for calibration is measured by irradiating an electron beam onto the Faraday cup in the same condition as that of the sample current measurement. By these measurements, the current value of the incident electron beam can be calibrated and a two dimensional distribution of crystallinity of the sample surface can be inspected. Embodiments using such measurements will be described below.

Embodiment 15

Figure 15:
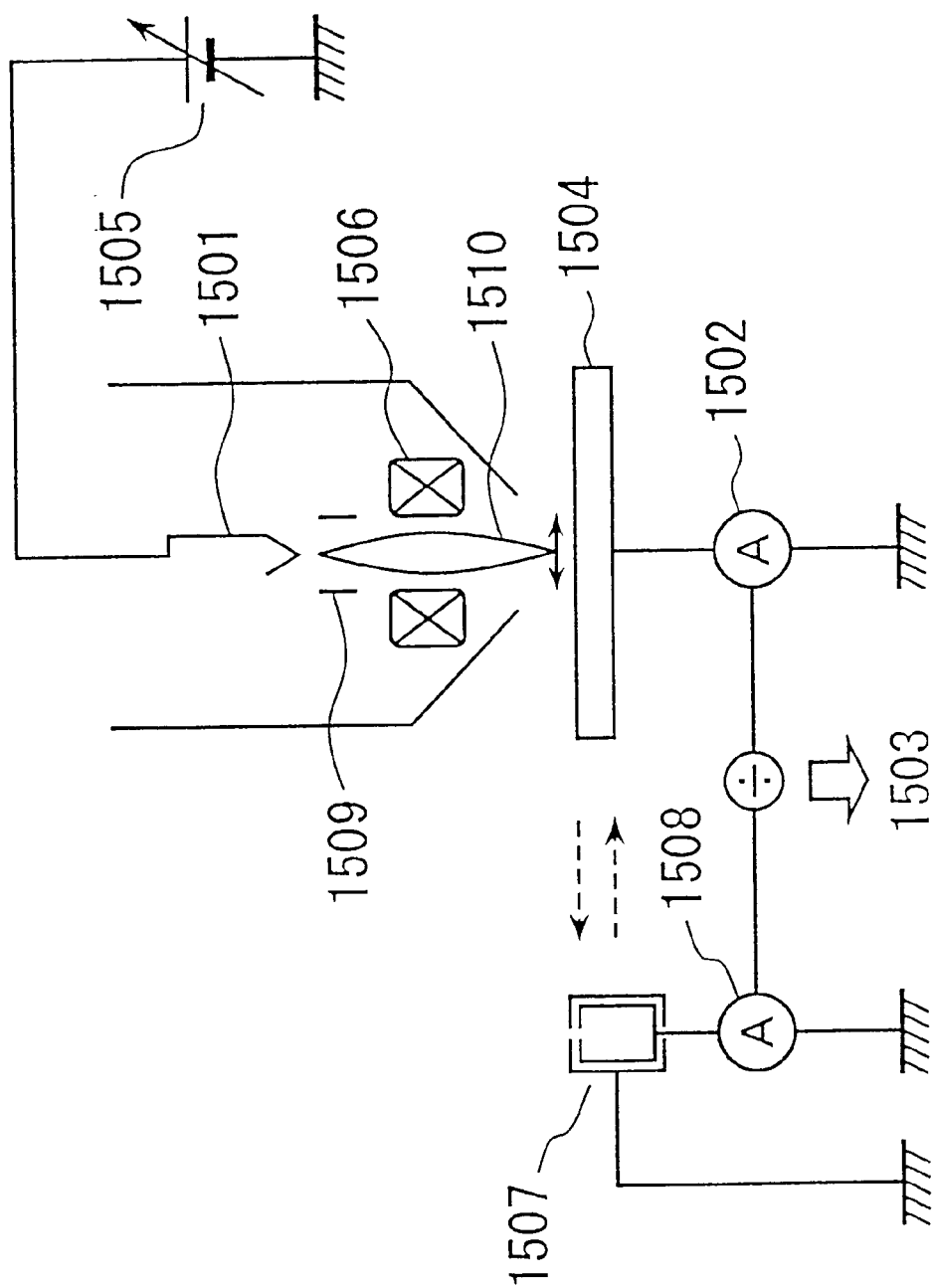
FIG. 15 is a conceptual view illustrating a sample current spectroscopy type surface measurement apparatus according to a fifteenth embodiment of the present invention.

FIG. 15 is a conceptual view illustrating a sample current spectroscopy type surface measurement apparatus according to a fifteenth embodiment of the present invention. This apparatus comprises an electron gun 1501 which can emit an electron beam onto a sample 1504, and an electron lens 1506 which is disposed between the electron gun 1501 and the sample and which focuses the electron beam emitted from the electron gun 1501. This apparatus also comprises a variable voltage source 1505 which is coupled, for example, between the electron gun 1501 and the ground and which supplies an acceleration voltage to the electron gun 1501, and a current detector 1502 for detecting a sample current, for example, a current from the sample 1504 to the ground. Further, there is provided scanning electrodes 1509 as a means for scanning the electron beam 1510 emitted from the electron gun 1501. The scanning electrodes 1509 are disposed, for example, between the electron gun 1501 and the electron lens 1506. However, the scanning electrodes 1509 can also be disposed between the electron lens 1506 and the sample 1504. Also, it is possible to use other scanning means, such as electromagnetic coils and so on. This apparatus further comprises a Faraday cup 1507 which can be disposed at the position an electron beam from the electron gun 1501 is irradiated, in place of the sample 1504.

In this apparatus, the electron beam 1510 emitted from the electron gun 1501 is focused by the electron lens 1506 and irradiated onto the sample 1504. Also, by the scanning electrodes 1509, the electron beam 1510 is scanned on the sample 1504. In this embodiment, the electron gun 1501 is constituted by an electron source of thermal field emission type which uses tungsten as a material thereof. That is, the electron gun 1501 is a Schottky emission electron gun. By irradiating electron beam onto the sample 1504 from such electron gun 1501, a current flows inside the sample 1504. Quantity of current of such sample current is measured by the current detector 1502 for detecting sample current.

In the fifteenth embodiment, while the electron beam is irradiated on a measurement point within a scanning range on the sample surface, acceleration energy of electrons irradiated from the electron gun 1501 is changed by changing the acceleration voltage of electrons by using the variable voltage source 1505. The acceleration energy of electrons is changed, for example, within a range from 10 through 5000 electron volts (eV). The acceleration voltage is thus changed and the sample current is measured by the current detector 1502. Thereby, variation of the sample current is measured with respect to the change of the acceleration voltage. Thereafter, an irradiation position of the electron beam is moved to a next measurement point on the sample surface, and the acceleration voltage of electrons is changed similarly to the above. Variation of sample current is measured by the current detector 1502 with respect to the change of the acceleration voltage. Such measurement is performed in each of the measurement points on the sample surface. Output data or signal 1503 of the measured sample current in each measurement point is supplied to, for example, a computer and so on, and is processed in accordance with the necessity of display, analysis and so on.

In the apparatus of this embodiment, the relation between the current value of the incident electron beam and the acceleration voltage can be previously obtained and stored. That is, after moving the Faraday cup 1507 to the position where an electron beam can be irradiated, the electron beam is emitted from the electron gun 1501. The emitted electron beam is focused by the electron lens 1506 and is all irradiated into the Faraday cup 1507. The acceleration voltage of the electrons emitted from the electron gun 1501 is changed by the variable voltage source 1505 under the same condition as that of the sample current measurement, that is, the acceleration energy of electrons is changed, for example, within a range from 10 through 5000 eV. The acceleration voltage is thus changed and the current value of the electron beam incident into the Faraday cup 1507 is measured by the current detector 1508 for calibrating the incident electron beam current. Data of the current value of the incident electron beam obtained by the current detector 1508 together with data of the acceleration voltage are stored, for example, in a storage of a computer not shown in the drawing as a data for current calibration. That is, the relation between the current value of the incident electron beam and the acceleration voltage is correctly obtained and stored. It is preferable to obtain such data for current calibration by using the Faraday cup 1507 prior to the measurement of the sample current. When the sample current is measured, the quantitative current value of the incident electron beam at each acceleration voltage is obtained by reading out the current value at the corresponding acceleration voltage from the storage storing the data for current calibration. For example, it is possible to obtain a proportion of the sample current to the current value of the incident electron beam. Therefore, the output 1503 of the measured current value obtained by measuring the sample current is normalized or standardized and is calibrated by the corresponding current value of the incident electron beam based on the stored data for current calibration.

Embodiment 16

Figure 16:
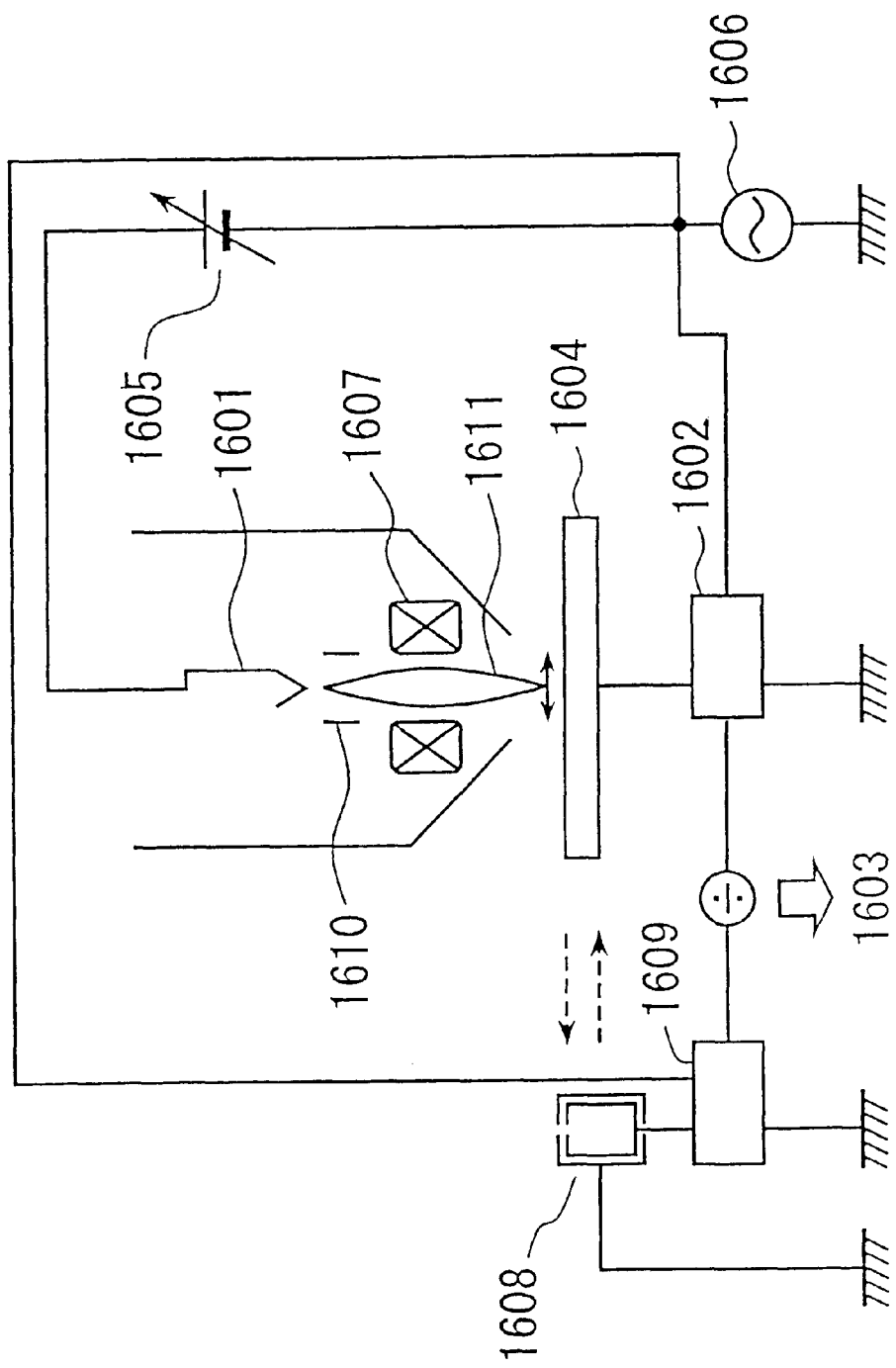
FIG. 16 is a conceptual view illustrating a sample current spectroscopy type surface measurement apparatus according to a sixteenth embodiment of the present invention.

FIG. 16 is a conceptual view illustrating a sample current spectroscopy type surface measurement apparatus according to a sixteenth embodiment of the present invention. This apparatus comprises an electron gun 1601 which can emit an electron beam onto a sample 1604, and an electron lens 1607 which is disposed between the electron gun 1601 and the sample and which focuses the electron beam emitted from the electron gun 1601. This apparatus also comprises a variable voltage source 1605 which is coupled, for example, between the electron gun 1601 and the ground and which supplies an acceleration voltage to the electron gun 1601. Also, there is provided a lock-in amplifier 1602 for detecting a sample current, for example, a current from the sample 1604 to the ground, and a sinusoidal voltage generator 1606 inserted into a connection between the variable voltage source 1605 and the ground for generating a sinusoidal voltage superimposed onto the acceleration voltage generated by the variable voltage source 1605. Further, there is provided scanning electrodes 1610 as a means for scanning the electron beam 1611 emitted from the electron gun 1601. The scanning electrodes 1610 are disposed, for example, between the electron gun 1601 and the electron lens 1607. However, the scanning electrodes 1610 can also be disposed between the electron lens 1607 and the sample 1604. Also, it is possible to use other scanning means, such as electromagnetic coils and so on.

In this apparatus, the electron beam 1611 emitted from the electron gun 1601 is focused by the electron lens 1607 and irradiated onto the sample 1604. Also, by the scanning electrodes 1610, the electron beam 1611 is scanned on the sample 1604. In this embodiment, the electron gun 1601 is constituted by an electron source of thermal field emission type which uses tungsten as a material thereof. That is, the electron gun 1601 is a Schottky emission electron gun. By irradiating electron beam onto the sample 1604 from such electron gun 1601, a current flows inside the sample 1604. Quantity of current of such sample current is measured by the lock-in amplifier 1602 for detecting sample current. This apparatus further comprises a Faraday cup 1608 which can be disposed at the position an electron beam from the electron gun 1601 is irradiated in place of the sample 1604. Also, there is provided a lock-in amplifier 1609 for calibrating an incident electron beam current.

In the sixteenth embodiment, while the electron beam is irradiated on a measurement point within a scanning range on the sample surface, acceleration energy of electrons irradiated from the electron gun 1601 is changed by changing the acceleration voltage of electrons by using the variable voltage source 1605, while superimposing the sinusoidal wave signal generated by the sinusoidal voltage generator 1606 onto the acceleration voltage. For example, the sinusoidal wave signal has an amplitude of 1 electron volts (eV) and a frequency of 6500 Hz. The acceleration energy of electrons is changed, for example, within a range from 10 through 5000 electron volts (eV). The acceleration voltage is thus changed and the sample current is measured by the lock-in amplifier 1602 which uses a signal of 6500 Hz obtained from the sinusoidal voltage generator 1606 as an external control signal. Thereby, variation of the sample current is measured with respect to the change of the acceleration voltage. Thereafter, an irradiation position of the electron beam is moved to a next measurement point on the sample surface, and the acceleration voltage of electrons is changed similarly to the above. Variation of sample current is measured by the lock-in amplifier 1602 with respect to the change of the acceleration voltage. Such measurement is performed in each of the measurement points on the sample surface. Output data or signal 1603 of the measured sample current in each measurement point is supplied to, for example, a computer and so on, and is processed in accordance with the necessity of display, analysis and so on.

In the apparatus of this embodiment, the relation between the current value of the incident electron beam and the acceleration voltage can be previously obtained and stored. That is, after moving the Faraday cup 1608 to the position where an electron beam can be irradiated, the electron beam is emitted from the electron gun 1601. The emitted electron beam is irradiated into the Faraday cup 1608. The acceleration voltage of the electrons emitted from the electron gun 1601 is changed by the variable voltage source 1605 under the same condition as that of the sample current measurement, that is, the acceleration energy of electrons is changed, for example, within a range from 10 through 5000 eV, while superimposing the sinusoidal wave signal generated by the sinusoidal voltage generator 1606 onto the acceleration voltage. For example, the sinusoidal wave signal has an amplitude of 1 electron volts (eV) and a frequency of 6500 Hz. The acceleration voltage is thus changed and variation of the current value of the electron beam incident into the Faraday cup 1608 is detected by the lock-in amplifier 1609 which uses a signal of 6500 Hz obtained from the sinusoidal voltage generator 1606 as an external control signal. Data of the current value of the incident electron beam obtained by the lock-in amplifier 1609 together with data of the acceleration voltage and so on are stored, for example, in a storage of a computer not shown in the drawing as a data for current calibration. That is, the relation between the current value of the incident electron beam and the acceleration voltage is correctly obtained and stored. It is preferable to obtain such data for current calibration by using the Faraday cup 1608 prior to the measurement of the sample current. When the sample current is measured, the quantitative current value of the incident electron beam at each acceleration voltage is obtained by reading out the current value at the corresponding acceleration voltage from the storage storing the data for current calibration. For example, it is possible to obtain a proportion of the sample current to the current value of the incident electron beam. Therefore, the output 1603 of the measured current value obtained by measuring the sample current is normalized or standardized and is calibrated by the corresponding current value of the incident electron beam based on the stored data for current calibration. In the present embodiment in which the sample current is measured by the lock-in amplifier having a function of selective amplification and in which the current value of the incident electron beam is calibrated by using the Faraday cup, it is preferable to perform both the measurement of the sample current and the measurement of the current value of the incident electron beam by the Faraday cup in the same condition.

Figure 17:
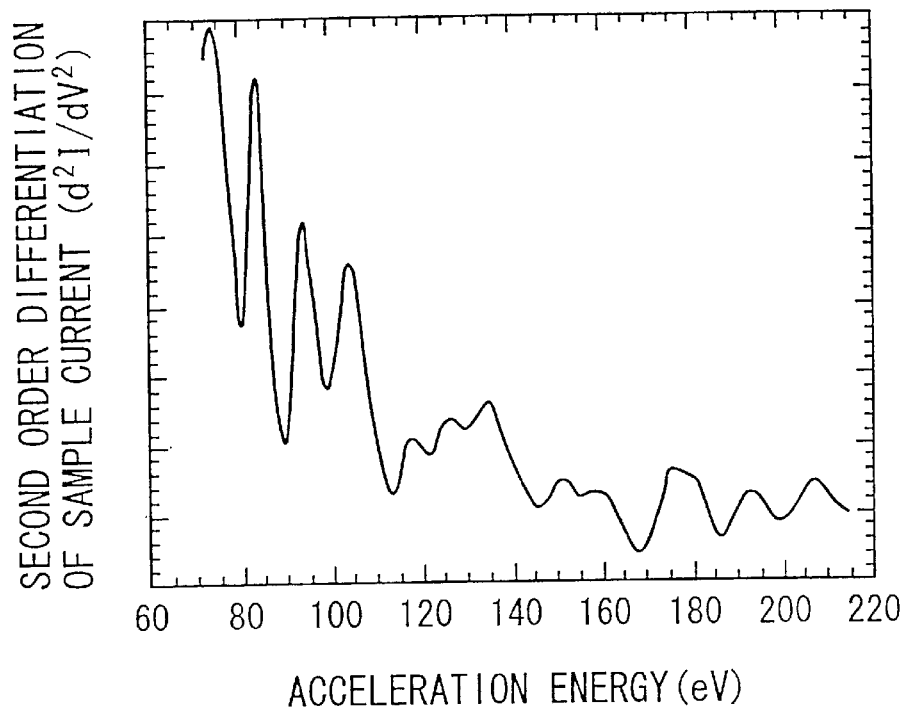
FIG. 17 is a graph showing an example of analysis result of crystallinity of a sample surface obtained by the apparatus according to the present invention.
Figure 18:
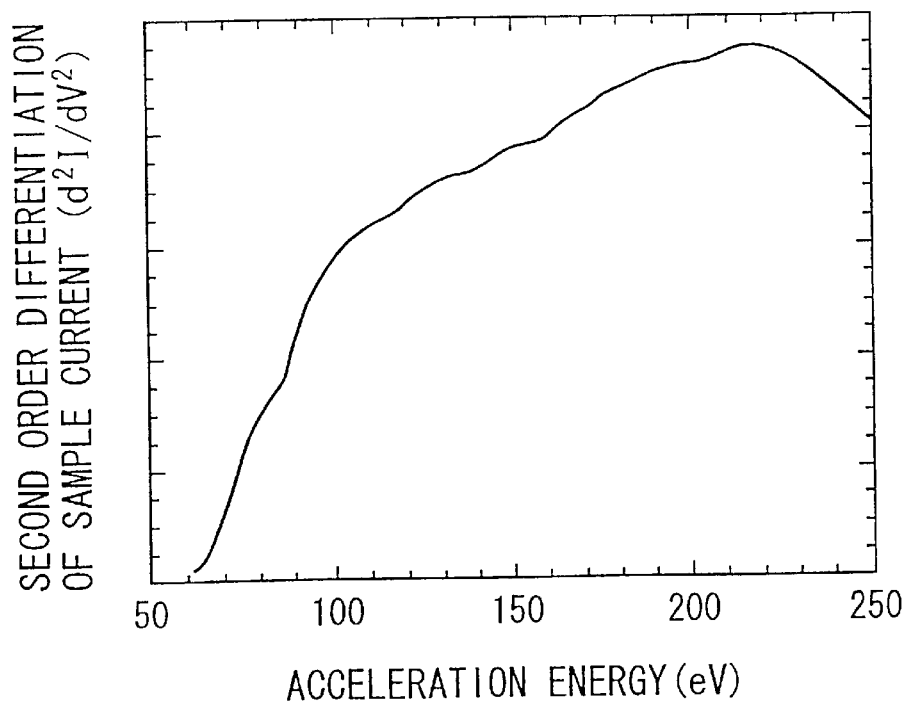
FIG. 18 is a graph showing another example of analysis result of crystallinity of a sample surface obtained by the apparatus according to the present invention.

FIG. 17 and FIG. 18 show representative examples of analysis results of crystallinity of sample surfaces obtained by the apparatuses according to the above-mentioned embodiments.

By using the apparatus according to the first embodiment, an electron beam was irradiated onto the surface of a silicon (100) single crystal sample, and a sample current was measured while changing the acceleration energy of electrons. Thereby, crystallinity of a region where the electron beam was irradiated was inspected. The acceleration energy of electrons of the irradiated electron beam was changed from 50 eV to 300 eV by changing acceleration voltage of electrons. FIG. 17 shows a sample current spectrum obtained as a result of such measurement. An abscissa of FIG. 17 designates an acceleration energy (eV), and an ordinate designates a sample current I twice differentiated by an acceleration voltage V. The sample current spectrum of the silicon (100) single crystal sample shown in FIG. 17 has many peaks each having a width of approximately 10 eV.

Also, by using the apparatus according to the first embodiment, an electron beam was irradiated onto the surface of a polycrystalline silicon sample, and a sample current was measured while changing the acceleration energy of electrons. Thereby, crystallity of a region where the electron beam was irradiated was inspected. The acceleration energy of electrons of the irradiated electron beam was changed from 50 eV to 300 eV by changing acceleration voltage of electrons. FIG. 18 shows a sample current spectrum obtained as a result of such measurement. An abscissa of FIG. 18 designates an acceleration energy (eV), and an ordinate designates a sample current I twice differentiated by an acceleration voltage V. The sample current spectrum of the polycrystalline silicon sample shown in FIG. 18 does not have peaks each having a width of approximately 10 eV as shown in FIG. 17.

The difference between the sample current spectrum of FIG. 17 and the sample current spectrum of FIG. 18 corresponds to whether or not diffraction spots appear in usual electron beam diffraction measurement. Usually, when the electron beam diffraction measurement is performed on a single crystal sample, diffraction spots appear. When the sample current of such single crystal sample is measured by the apparatus of this embodiment, dependency curve of the sample current on the acceleration energy has some local variations as seen from FIG. 17. On the other hand, when the electron beam diffraction measurement is performed on a polycrystaliine or amorphous sample, diffraction spot does not appear usually. When the sample current of such polycrystalline or amorphous sample is measured by the apparatus of this embodiment, the sample current varies relatively smoothly depending on the acceleration energy as shown in FIG. 18. From such difference, it is possible, for example, to determine crystallinty of an area irradiated by an electron beam, for example, it is possible to distinguish whether the area is in a single crystal condition or in a polycrystalline or amorphous condition.

As apparent from the above description, according to the present invention, it is possible to inspect crystallinity or a condition of crystal of a sample surface, by irradiating an electron beam onto the sample surface and by measuring a current which flows into the sample, without directly measuring a quantity of electrons scattered or emitted from the sample. Therefore, it is possible to inspect crystallinity of an area at the bottom of a deep and narrow hole formed vertically on the sample surface. Conventionally, it was impossible to inspect crystallinity of such area. In the present invention, it is possible, for example, to inspect whether an area at the bottom of a deep and narrow hole is in a single crystal condition or in a polycrystalline or amorphous condition. Also, it is possible to inspect whether or not contaminant comprising polycrystalline or amorphous material adheres to a single crystal area at the bottom of a deep and narrow hole.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. An apparatus for sample current spectroscopy surface measurement comprising:

an electron gun for irradiating an electron beam onto a surface of a sample;

a variable voltage source for supplying an acceleration voltage which is variable to change an acceleration energy of said electron beam irradiated from said electron gun onto said surface of said sample; and a sample current measurement means for measuring a sample current which flows into said sample when said electron beam is irradiated from said electron gun onto said surface of said sample;

wherein a variation of said sample current is detected by measuring said sample current by said sample current measurement means when said acceleration energy of said electron beam irradiated by said electron gun onto said surface of said sample is changed by said variable voltage source and wherein said sample current detects a crystallinity quality value of said surface of said sample.

2. An apparatus for sample current spectroscopy surface measurement as set forth in claim 1, further comprising:

an electron lens for focusing said electron beam emitted from said electron gun, said electron beam emitted from said electron gun irradiated onto said surface of said sample after said focusing by said electron lens.

3. An apparatus for sample current spectroscopy surface measurement as set forth in claim 1, further comprising:

an electron deflection means for scanning said electron beam emitted from said electron gun;

wherein said electron beam is irradiated onto and scanned across said surface of said sample by said electron deflection means;

wherein the variation of said sample current is detected by using said sample current measurement means in each of a plurality of measurement points within a scanning region on the surface of the sample while changing said acceleration energy of electrons irradiated onto said surface of said sample from said electron gun by said variable voltage source, thereby inspecting the crystallinity of said surface of said sample.

4. An apparatus for sample current spectroscopy surface measurement as set forth in claim 1, further comprising:

a Faraday cup onto which said electron beam from said electron gun is irradiated in place of said surface of said sample; and a Faraday cup current measuring means which measures a current flowing into said Faraday cup when said electron beam is irradiated onto said Faraday cup by said electron gun;

wherein a variation of said current flowing into said Faraday cup is detected by measuring said current flowing into said Faraday cup by said Faraday cup current measuring means when said acceleration energy of said electron beam irradiated onto said Faraday cup by said electron gun is changed by said variable voltage source, and the variation of said sample current is detected by measuring said sample current by said sample current measurement means when said acceleration energy of said electron beam irradiated onto said surface of said sample by said electron gun is changed by said variable voltage source; and wherein each of a plurality of sample current values measured by said sample current measurement means is normalized by using a current value at a corresponding acceleration energy measured by said Faraday cup current measuring means.

5. An apparatus for sample current spectroscopy surface measurement as set forth in claim 2, wherein said acceleration energy of said electron beam irradiated from said electron gun is changed in a range from 10 to 5000 electron volts by said variable voltage source.

6. An apparatus for sample current spectroscopy surface measurement as set forth in claim 1, further comprising:

a sinusoidal wave voltage generating means;

wherein a sinusoidal wave voltage generated by said sinusoidal wave voltage generating means is superimposed on said acceleration voltage supplied by said variable voltage source, when the variation of said sample current is detected by measuring said sample current by said sample current measurement means while changing said acceleration energy of said electron beam irradiated onto said surface of said sample by said electron gun by said variable voltage source.

7. A method for sample current spectroscopy surface measurement comprising:

irradiating an electron beam onto a surface of a sample; and inspecting a crystallinity quality value of said surface of said sample by measuring a variation of a sample current flowing into said sample when an acceleration energy of said electron beam irradiated onto said surface of said sample is changed.

8. A method for sample current spectroscopy surface measurement as set forth in claim 7, wherein said electron beam is focused by an electron lens and irradiated onto a selected local region on said surface of said sample, thereby the crystallinity of said selected local region on said surface of said sample is inspected.

9. A method for sample current spectroscopy surface measurement as set forth in claim 7, wherein said electron beam is focused by an electron lens and scanned on said surface of said sample, and wherein variation of said sample current is detected in each of a plurality of measurement points within a scanning region on said surface of said sample while changing said acceleration energy of electrons irradiated onto said surface of said sample, thereby inspecting the crystallinity of said surface of said sample.

10. A method for sample current spectroscopy surface measurement as set forth in claim 8, further comprising:

irradiating said electron beam onto a Faraday cup; and a variation of a current flowing into said Faraday cup is measured when an acceleration energy of said electron beam irradiated onto said Faraday cup is changed, and the variation of said sample current is measured when said acceleration energy of said electron beam irradiated onto said surface of said sample is changed, and wherein each measured sample current value is normalized by using a current value of a current flowing into a Faraday cup at a corresponding acceleration energy.

11. A method for sample current spectroscopy surface measurement as set forth in claim 10, wherein measuring the variation of said current flowing into said Faraday cup when an acceleration energy of said electron beam irradiated onto said Faraday cup is changed is performed prior to measuring the variation of said sample current when said acceleration energy of said electron beam irradiated onto said surface of said sample is changed.

12. A method for sample current spectroscopy surface measurement as set forth in claim 7, wherein said acceleration energy of said electron beam irradiated onto said surface of said sample is changed in a range from 10 to 5000 electron volts.

13. A method for sample current spectroscopy surface measurement as set forth in claim 7, wherein a sinusoidal wave voltage is superimposed on said acceleration voltage, when the variation of said sample current is detected by measuring said sample current while changing said acceleration energy of said electron beam irradiated onto said surface of said sample.

* * * * *